(12) United States Patent
Morrison et al.

(10) Patent No.: US 11,709,219 B2
(45) Date of Patent: *Jul. 25, 2023

(54) METHOD OF CALIBRATING IMPEDANCE MEASUREMENTS OF A BATTERY

(71) Applicant: Dynexus Technology, Inc., Loveland, CO (US)

(72) Inventors: John L. Morrison, Butte, MO (US); William H. Morrison, Butte, MO (US)

(73) Assignee: Dynexus Technology, Inc., Loveland, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 17/188,741

(22) Filed: Mar. 1, 2021

(65) Prior Publication Data
US 2021/0181290 A1   Jun. 17, 2021

Related U.S. Application Data

(63) Continuation of application No. 16/852,231, filed on Apr. 17, 2020, now Pat. No. 10,942,240, which is a
(Continued)

(51) Int. Cl.
*G01R 35/00* (2006.01)
*G01R 31/389* (2019.01)
*G01R 31/367* (2019.01)

(52) U.S. Cl.
CPC ......... *G01R 35/005* (2013.01); *G01R 31/367* (2019.01); *G01R 31/389* (2019.01)

(58) Field of Classification Search
CPC ... G01R 35/005; G01R 31/389; G01R 31/367
See application file for complete search history.

(56) References Cited

U.S. PATENT DOCUMENTS

| | | |
|---|---|---|
| 4,498,044 A | 2/1985 | Horn |
| 4,697,134 A | 9/1987 | Burkum et al. |

(Continued)

FOREIGN PATENT DOCUMENTS

| | | |
|---|---|---|
| EP | 2447728 B1 | 6/2013 |
| JP | 2000-009817 A | 1/2000 |

(Continued)

OTHER PUBLICATIONS

Adany et al. Switching algorithms for extending battery life in Electric Vehicles. Journal of Power Sources, Jun. 2013, 231:50-59.
(Continued)

*Primary Examiner* — Raymond L Nimox
(74) *Attorney, Agent, or Firm* — Craig R. Miles; CR Miles P.C.

(57) ABSTRACT

A method of calibration is described that simplifies the measurement of battery impedance conducted in-situ while determining battery state-of-health. A single shunt measurement with a known Sum of Sines (SOS) current, at the desired frequency spread and known root mean squared (RMS) current is used to create a calibration archive. A calibration selected from this archive is used to calibrate an impedance measurement made on the battery.

11 Claims, 19 Drawing Sheets

Related U.S. Application Data continuation of application No. 16/432,822, filed on Jun. 5, 2019, now Pat. No. 10,656,233, which is a continuation of application No. 15/497,142, filed on Apr. 25, 2017, now Pat. No. 10,436,873.

(60) Provisional application No. 62/331,730, filed on May 4, 2016, provisional application No. 62/326,923, filed on Apr. 25, 2016.

(56) References Cited

U.S. PATENT DOCUMENTS

| | | |
|---|---|---|
| 5,061,890 A | 10/1991 | Longini |
| 5,261,007 A | 11/1993 | Hirsch |
| 5,281,920 A | 1/1994 | Wurst |
| 5,349,535 A | 9/1994 | Gupta |
| 5,406,496 A | 4/1995 | Quinn |
| 5,457,377 A | 10/1995 | Jonsson |
| 5,512,832 A | 4/1996 | Russel et al. |
| 5,747,456 A | 5/1998 | Chorev et al. |
| 5,773,978 A | 6/1998 | Becker |
| 5,821,757 A | 10/1998 | Alvarez et al. |
| 5,946,482 A | 8/1999 | Barford et al. |
| 5,969,625 A | 10/1999 | Russo |
| 6,002,238 A | 12/1999 | Champlin |
| 6,072,299 A | 6/2000 | Kurle et al. |
| 6,160,382 A | 12/2000 | Yoon et al. |
| 6,208,147 B1 | 3/2001 | Yoon et al. |
| 6,222,369 B1 | 4/2001 | Champlin |
| 6,249,186 B1 | 6/2001 | Ebihara et al. |
| 6,262,563 B1 | 7/2001 | Champlin |
| 6,307,378 B1 | 10/2001 | Kozlowski |
| 6,313,607 B1 | 11/2001 | Champlin |
| 6,330,933 B1 | 12/2001 | Boeckman et al. |
| 6,340,889 B1 | 1/2002 | Sakurai |
| 6,359,419 B1 | 3/2002 | Verbrugge et al. |
| 6,417,669 B1 | 7/2002 | Champlin |
| 6,472,847 B2 | 10/2002 | Lundberg |
| 6,481,289 B2 | 11/2002 | Dixon et al. |
| 6,519,539 B1 | 2/2003 | Freeman et al. |
| 6,532,425 B1 | 3/2003 | Boost et al. |
| 6,542,077 B2 | 4/2003 | Joao |
| 6,556,001 B1 | 4/2003 | Wiegand et al. |
| 6,639,385 B2 | 10/2003 | Verbrugge et al. |
| 6,646,419 B1 | 11/2003 | Uing |
| 6,653,817 B2 | 11/2003 | Tate, Jr. et al. |
| 6,691,095 B2 | 2/2004 | Singh et al. |
| 6,693,439 B1 | 2/2004 | Liu et al. |
| 6,778,913 B2 | 8/2004 | Tinnemeyer |
| 6,816,797 B2 | 11/2004 | Freeman et al. |
| 6,832,171 B2 | 12/2004 | Barsoukov et al. |
| 6,839,597 B2 | 1/2005 | Hattori et al. |
| 6,876,174 B1 | 4/2005 | Samittier Marti et al. |
| 6,922,058 B2 | 6/2005 | Potempa |
| 7,019,542 B2 | 3/2006 | Tinnemeyer |
| 7,051,008 B2 | 5/2006 | Singh et al. |
| 7,065,474 B2 | 6/2006 | Petchenev et al. |
| 7,072,871 B1 | 7/2006 | Tinnemeyer |
| 7,113,853 B2 | 9/2006 | Hecklinger |
| 7,259,572 B2 | 8/2007 | Houldsworth et al. |
| 7,349,816 B2 | 3/2008 | Quint et al. |
| 7,395,163 B1 * | 7/2008 | Morrison ............ G01R 31/389 324/603 |
| 7,567,057 B2 | 7/2009 | Elder et al. |
| 7,598,700 B2 | 10/2009 | Elder et al. |
| 7,616,003 B2 | 11/2009 | Satoh et al. |
| 7,675,293 B2 | 3/2010 | Christophersen et al. |
| 7,688,036 B2 | 3/2010 | Yarger et al. |
| 7,688,074 B2 | 3/2010 | Cox et al. |
| 7,698,078 B2 | 4/2010 | Kelty et al. |
| 7,898,263 B2 | 3/2011 | Ishida et al. |
| 7,928,735 B2 | 4/2011 | Huang et al. |
| 8,035,396 B2 | 10/2011 | Kim |
| 8,150,643 B1 * | 4/2012 | Morrison ............ G01R 31/389 324/603 |
| 8,193,771 B2 | 6/2012 | Coccio |
| 8,332,342 B1 | 12/2012 | Saha et al. |
| 8,352,204 B2 | 1/2013 | Morrison et al. |
| 8,368,357 B2 | 2/2013 | Ghantous et al. |
| 8,410,783 B2 | 4/2013 | Staton |
| 8,415,926 B2 | 4/2013 | Bhardwaj et al. |
| 8,427,112 B2 | 4/2013 | Ghantous et al. |
| 8,447,544 B2 | 5/2013 | Hsu et al. |
| 8,467,984 B2 | 6/2013 | Gering |
| 8,487,628 B2 | 7/2013 | Sciarretta et al. |
| 8,513,921 B2 | 8/2013 | Berkowitz et al. |
| 8,521,497 B2 | 8/2013 | Gering |
| 8,532,945 B2 | 9/2013 | Sciarretta et al. |
| 8,548,762 B2 | 10/2013 | Prada et al. |
| 8,582,675 B1 | 11/2013 | Harris |
| 8,598,849 B2 | 12/2013 | Bhardwaj et al. |
| 8,638,070 B2 | 1/2014 | Maluf et al. |
| 8,648,602 B2 | 2/2014 | van Lammeren |
| 8,680,868 B2 | 3/2014 | van Lammeren et al. |
| 8,710,847 B2 | 4/2014 | Marvin et al. |
| 8,725,456 B1 | 5/2014 | Saha et al. |
| 8,738,310 B2 | 5/2014 | Swanton |
| 8,738,311 B2 | 5/2014 | Wu |
| 8,762,109 B2 | 6/2014 | Christophersen et al. |
| 8,773,145 B2 | 7/2014 | Phlippoteau et al. |
| 8,791,669 B2 | 7/2014 | Ghantous et al. |
| 8,831,897 B2 | 9/2014 | McHardy |
| 8,838,401 B2 | 9/2014 | Kelly |
| 8,849,598 B2 | 9/2014 | Mingant et al. |
| 8,868,363 B2 | 10/2014 | Morrison et al. |
| 8,878,549 B2 | 11/2014 | Nakanishi et al. |
| 8,889,309 B2 | 11/2014 | Manabe et al. |
| 8,901,886 B2 | 12/2014 | Berkowitz et al. |
| 8,907,631 B1 | 12/2014 | Gurries et al. |
| 8,907,675 B2 | 12/2014 | Phlippoteau et al. |
| 8,952,823 B2 | 2/2015 | Xie et al. |
| 8,970,178 B2 | 3/2015 | Berkowitz et al. |
| 8,975,874 B2 | 3/2015 | Berkowitz et al. |
| 9,030,173 B2 | 5/2015 | McHardy et al. |
| 9,035,621 B2 | 5/2015 | Berkowitz et al. |
| 9,035,623 B1 | 5/2015 | Berkowitz et al. |
| 9,063,018 B1 | 6/2015 | Ghantous et al. |
| 9,121,910 B2 | 9/2015 | Maluf et al. |
| 9,142,994 B2 | 9/2015 | Berkowitz et al. |
| 9,207,285 B1 | 12/2015 | Swanton et al. |
| 9,244,130 B2 | 1/2016 | Morrison et al. |
| 9,252,465 B2 | 2/2016 | Hariharan |
| 9,312,577 B2 | 4/2016 | Jamison |
| 9,373,972 B2 | 6/2016 | Ghantous et al. |
| 9,385,555 B2 | 7/2016 | Ghantous et al. |
| 9,461,492 B1 | 10/2016 | Berkowitz et al. |
| 9,465,077 B2 | 10/2016 | Love et al. |
| 9,519,031 B2 | 12/2016 | Jamison |
| 9,669,723 B2 | 6/2017 | Sugeno et al. |
| 9,851,414 B2 | 12/2017 | Morrison et al. |
| 10,189,354 B2 | 1/2019 | Brochhaus |
| 10,345,384 B2 | 7/2019 | Christophersen et al. |
| 10,379,168 B2 | 8/2019 | Christophersen et al. |
| 10,436,873 B1 | 10/2019 | Morrison et al. |
| 10,656,233 B2 | 5/2020 | Morrison et al. |
| 10,942,240 B2 | 3/2021 | Morrison et al. |
| 2001/0035756 A1 | 11/2001 | Kozlowski |
| 2002/0065621 A1 | 5/2002 | Jungerman |
| 2003/0184307 A1 | 10/2003 | Kozlowski et al. |
| 2003/0206021 A1 | 11/2003 | Laletin et al. |
| 2004/0095249 A1 | 5/2004 | Zaccaria |
| 2004/0162683 A1 | 8/2004 | Verbrugge et al. |
| 2005/0086070 A1 | 4/2005 | Engelman |
| 2005/0127908 A1 | 6/2005 | Schlicker et al. |
| 2005/0182584 A1 | 8/2005 | Plusquellic |
| 2006/0111854 A1 | 5/2006 | Plett |
| 2006/0111870 A1 | 5/2006 | Plett |
| 2006/0170397 A1 | 8/2006 | Srinivasan et al. |
| 2006/0186890 A1 | 8/2006 | Iwane et al. |
| 2006/0284617 A1 | 12/2006 | Kozlowski et al. |
| 2006/0284618 A1 | 12/2006 | Cho et al. |
| 2007/0172708 A1 | 7/2007 | Takebe et al. |
| 2007/0182371 A1 | 8/2007 | Boebel |
| 2007/0182576 A1 | 8/2007 | Proska et al. |

(56) References Cited

U.S. PATENT DOCUMENTS

| | | |
|---|---|---|
| 2007/0257681 A1 | 11/2007 | Christophersen et al. |
| 2008/0303528 A1 | 12/2008 | Kim |
| 2009/0076752 A1 | 3/2009 | Wang et al. |
| 2009/0278037 A1 | 11/2009 | Grothe, Jr. |
| 2010/0010762 A1 | 1/2010 | Seki |
| 2010/0121588 A1 | 5/2010 | Elder et al. |
| 2010/0201320 A1 | 8/2010 | Coe et al. |
| 2010/0207772 A1 | 8/2010 | Yamamoto |
| 2010/0274510 A1* | 10/2010 | Morrison ........... G01R 31/2837 702/75 |
| 2010/0332165 A1 | 12/2010 | Morrison et al. |
| 2011/0018543 A1 | 1/2011 | Bos et al. |
| 2011/0077879 A1 | 3/2011 | Paryani |
| 2011/0077880 A1 | 3/2011 | Gering |
| 2011/0082621 A1 | 4/2011 | Berkobin et al. |
| 2011/0169452 A1 | 7/2011 | Cooper et al. |
| 2011/0270559 A1 | 11/2011 | Christophersen et al. |
| 2011/0301931 A1 | 12/2011 | Gering |
| 2012/0019253 A1 | 1/2012 | Ziegler et al. |
| 2012/0032688 A1 | 2/2012 | Christophersen et al. |
| 2012/0038452 A1 | 2/2012 | Phlippoteau et al. |
| 2012/0078552 A1 | 3/2012 | Mingant et al. |
| 2012/0105070 A1 | 5/2012 | van Lammeren et al. |
| 2012/0188086 A1 | 7/2012 | Xie et al. |
| 2012/0217985 A1 | 8/2012 | Amanuma |
| 2012/0262186 A1 | 10/2012 | Morrison et al. |
| 2012/0316815 A1 | 12/2012 | Morigaki |
| 2013/0002267 A1 | 1/2013 | Kothandaraman et al. |
| 2013/0069660 A1 | 3/2013 | Bernard et al. |
| 2013/0135110 A1 | 5/2013 | Xie et al. |
| 2013/0141109 A1 | 6/2013 | Love et al. |
| 2013/0229156 A1 | 9/2013 | Brandon et al. |
| 2013/0245973 A1 | 9/2013 | Ross, Jr. et al. |
| 2013/0267943 A1 | 10/2013 | Hancock |
| 2014/0125284 A1 | 5/2014 | Qahouq |
| 2014/0188414 A1 | 7/2014 | Jeong et al. |
| 2014/0358462 A1* | 12/2014 | Christophersen .... G01R 31/392 702/65 |
| 2014/0372054 A1 | 12/2014 | Wang et al. |
| 2014/0372055 A1 | 12/2014 | Wang et al. |
| 2015/0002105 A1 | 1/2015 | Kelly |
| 2015/0165921 A1 | 6/2015 | Paryani |
| 2015/0168500 A1 | 6/2015 | Jamison |
| 2015/0197159 A1 | 7/2015 | Lee |
| 2015/0280290 A1 | 10/2015 | Saha et al. |
| 2016/0157014 A1 | 6/2016 | Van Schyndel et al. |
| 2016/0157015 A1 | 6/2016 | Van Schyndel |
| 2016/0274060 A1 | 9/2016 | Denenberg et al. |
| 2017/0003354 A1 | 1/2017 | Morrison et al. |
| 2017/0254859 A1 | 9/2017 | Christophersen et al. |
| 2018/0143257 A1 | 5/2018 | Garcia et al. |
| 2019/0214937 A1 | 7/2019 | Schmidt |

FOREIGN PATENT DOCUMENTS

| | | |
|---|---|---|
| JP | 2003-090869 A | 3/2003 |
| JP | 2003-223918 A | 8/2003 |
| JP | 2007-085772 A | 4/2007 |
| JP | 2011-174925 A | 9/2011 |
| JP | 2012-078287 A | 4/2012 |
| JP | 2013-517755 A | 5/2013 |
| JP | 014-106119 A | 6/2014 |
| JP | 2015-078992 A | 4/2015 |
| WO | 2004/106946 A2 | 12/2004 |
| WO | 2010/144834 A2 | 12/2010 |
| WO | 2010/144857 A2 | 12/2010 |
| WO | 2011/041094 A1 | 4/2011 |
| WO | 2011/140123 A1 | 11/2011 |
| WO | 2011/140131 A1 | 11/2011 |
| WO | WO 2012/025706 A1 | 3/2012 |
| WO | 2013/085996 A1 | 6/2013 |
| WO | 2014/070831 A1 | 5/2014 |
| WO | 2015/029647 A1 | 3/2015 |
| WO | 2016/012922 A1 | 1/2016 |
| WO | WO 2017/003917 A1 | 1/2017 |
| WO | 2020/223630 | 11/2020 |
| WO | 2020/223651 | 11/2020 |

OTHER PUBLICATIONS

Ahmed et al. Enabling fast charging—A battery technology gap assessment. Journal of Power Sources, Nov. 2017, 367:250-262.

Baert et al. Determination of the State-of-Health of VRLA Batteries by Means of Noise Measurements. Intelec 2001, Nov. 2001, Conference Publication No. 484, pp. 301-306.

Bald et al. Hardware Architecture for Rapid Impedance Measurements of 50V Battery Modules. San Diego: The International Society of Automation, 58th International Instrumentation Symposium, INL/CON-12-24516, Jun. 2012, 18 pages.

Banaei et al. Online Detection of terminal voltage in Li-ion Batteries via Battery Impulse Response. IEEE, Oct. 2009, pp. 194-198.

Barsukov et al. Challenges and Solutions in Battery Fuel Gauging. Power Management Workbook, 2004, 10 pages, Texas Instruments Inc.

Beelen et al. A comparison and accuracy analysis of impedance-based temperature estimation methods for Li-ion batteries. Applied Energy, Aug. 2016, 175:128-140.

Berecibar et al. Critical review of state of health estimation methods of Li-ion batteries for real applications. Renewable and Sustainable Energy Reviews, Apr. 2016, 56:572-587.

Blanke, et al. Impedance measurements on lead-acid batteries for state-of-charge, state-of-health and cranking capability prognosis in electric and hybrid electric vehicles. Journal of Power Sources, Jun. 2005, 144:418-425.

Blidberg. Correlation between different impedance measurement methods for battery cells. KTH Chemical Science and Engineering, 2012, 42 pages, Stockholm, Sweden.

Bohlen et al. Impedance Based Battery Diagnosis for Automotive Applications. 35th Annual IEEE Power Electronics Specialists Conference, Apr. 2004, 4:2192-2797.

Bose et al. Battery state of health estimation through coup de fouet: field experience. INTELEC, Twenty-Second International Telecommunications Energy Conference (Cat. No.00CH37131), 2000, pp. 597-601.

Bose et al. Lessons Learned in Using OHMIC Techniques for Battery Monitoring. IEEE, 2001, pp. 99-104.

Brauer et al. Residential Energy Storage from Repurposed Electric Vehicle Batteries: Market Overview and Development of a Service-Centered Business Model. IEEE 18th Conference on Business Informatics, Aug. 2016, pp. 143-152.

Breugelmans et al. Odd random phase multisine electrochemical impedance spectroscopy to quantify a non-stationary behaviour: Theory and validation by calculating an instantaneous impedance value. Electrochimica Acta, Aug. 2012, 76:375-382.

Burnham et al. Enabling fast charging—Infrastructure and economic considerations. Journal of Power Sources, Nov. 2017, 367:237-249.

Cabrera-Castillo et al. Calculation of the state of safety (SOS) for lithium ion batteries. Journal of Power Sources, Aug. 2016, 324:509-520.

Carkhuff et al. Impedance-Based Battery Management System for Safety Monitoring of Lithium-Ion Batteries. IEEE Transactions on Industrial Electronics, Aug. 2018, 65(8):6497-6504.

Chan. Swept Sine Chirps for Measuring Impulse Response. Stanford Research Systems Inc., https://thinksrs.com/downloads/pdfs/applicationnotes/SR1_SweptSine.pdf, 2010, 6 pages.

Cheng et al. Battery-Management System (BMS) and SOC Development for Electrical Vehicles. IEEE Transactions on Vehicular Technology, Jan. 2011, 60(1):76-88.

(56) References Cited

OTHER PUBLICATIONS

Christensen et al. Using on-board Electrochemical Impedance Spectroscopy in Battery Management Systems. World Electric Vehicle Journal, Nov. 2013, 6:0793-0799.

Cordioli et al. Development of a Methodology Based on Odd Random Phase Electrochemical Impedance Spectroscopy to Evaluate Corrosion Protection of Coatings. Proceedings of the 4th International Conference on Self-Healing Materials, Jun. 2013, pp. 152-155.

Cox et al. Battery State of Health Monitoring, Combining Conductance Technology with other Measurement Parameters for Real-Time Battery Performance Analysis. INTELEC, International Telecommunications Energy Conference (Proceedings), Feb. 2000, 19-2, pp. 342-347.

Crow et al. Integrated Prognostic Health Monitoring of Battery Health in Ground Robots. Penn State Applied Research Laboratory, 32nd Association for Unmanned Vehicle Systems International Meeting, Jun. 2005, 16 pages.

Damlund. Analysis and Interpretation of AC-measurements on Batteries used to assess State-of-Health and Capacity-condition. IEEE, 1995, pp. 828-833.

Diard et al. Constant load vs constant current EIS study of electrochemical battery discharge. Electrochimica Acta, 1997, 42(23-24):3417-3420.

Diard et al. EIS study of electrochemical battery discharge on constant load. Journal of Power Sources, Jan. 1998, 70(1):78-84.

Diard et al. Impedance measurements of polymer electrolyte membrane fuel cells running on constant load. Journal of Power Sources, Aug. 1998, 74(2):244-245.

Dung et al. ILP-Based Algorithm for Lithium-Ion Battery Charging Profile. IEEE, 2010, pp. 2286-2291.

Farmann et al. Critical review of on-board capacity estimation techniques for lithium-ion batteries in electric and hybrid electric vehicles. Journal of Power Sources, May 2015, 281:114-130.

Goebel et al. Prognostics in Battery Health Management. IEEE Instrumentation & Measurement Magazine, Sep. 2008, 11(4):33-40.

Gopalakrishnan et al. Electrochemical impedance spectroscopy characterization and parameterization of lithium nickel manganese cobalt oxide pouch cells: dependency analysis of temperature and state of charge. Ionics 25(1), Jan. 2019 (published online Jun. 2018, Springer, Germany), 14 pages.

Gould et al. New Battery Model and State-of-Health Determination Through Subspace Parameter Estimation and State-Observer Techniques. IEEE Transactions on Vehicular Technology. Oct. 2009, 58(8):3905-3916.

Guha et al. Remaining Useful Life Estimation of Lithium-Ion Batteries based on the Internal Resistance Growth Model. Indian Control Conference (ICC), Jan. 2017, pp. 33-38.

Hariprakash et al. Monitoring sealed automotive lead-acid batteries by sparse-impedance spectroscopy. Proc. Indian Acad. Sci. (Chem. Sci.), Oct. 2003, 115(5):465-472.

Hariprakash et al. On-line monitoring of lead-acid batteries by galvanostatic non-destructive technique. Journal of Power Sources, Oct. 2004, 137(1):128-133.

Harting et al. State-of-Health Diagnosis of Lithium-Ion Batteries Using Nonlinear Frequency Response Analysis. Journal of The Electrochemical Society, Jan. 2019, 166(2):A277-A285.

Hill et al. Steady State Frequency Response Utilizing an Enhanced Chirp Test Signal. 2019 IEEE Aerospace Conference, Mar. 2019, pp. 1-8.

Hlavac et al. VRLA Battery Monitoring Using Conductance Technology. IEEE, 12-3 (1995) pp. 284-291.

Howey et al. On-line measurement of battery impedance using motor controller excitation. IEEE Transactions on Vehicular Technology, Jul. 2014, 63(6):2557-2566.

Huang et al. An Online Battery Impedance Measurement Method Using DC-DC Power Converter Control. IEEE Transactions on Industrial Electronics, Nov. 2014, 61(11):5987-5995.

Karden et al. A method for measurement of interpretation of impedance spectra for industrial batteries. Journal of Power Sources, Jan. 2000, 85(1):72-78.

Kolmel et al. Quality-oriented production planning of battery assembly systems for electric mobility. Procedia CIRP 23, Dec. 2014, pp. 149-154.

Kozlowski A Novel Online Measurement Technique for AC Impedance of Batteries and Other Electrochemical Systems. The Sixteenth Annual Battery Conference on Applications and Advances (Proceedings), Jan. 2001, pp. 257-262.

Kozlowski. Electrochemical Cell Prognostics using Online Impedance Measurements and Model-Based Data Fusion Techniques. Aerospace Conference, 2003 Proceedings, vol. 7-3257, Mar. 2003, 14 pages.

Lamb et al. Determination of Battery Stability With Advanced Diagnostics. SAND2017-6959, Unlimited Release, Jul. 2017, 56 pages.

Lamb et al. Determination of Battery Stability With Advanced Diagnostics. (Report No. DOT HS 812 249), Washington, DC: National Highway Traffic Safety Administration, Mar. 2016, 42 pages.

Le et al. Lithium-ion Battery State of Health Estimation Using Ah-V Characterization. Annual Conference of the Prognostics and Health Management Society, 2011, 3(1), 7 pages.

Li et al. Understanding the molecular mechanism of pulse current charging for stable lithium-metal batteries. Science Advances, Jul. 2017, 3(7), 10 pages.

Love et al. State-of-Health Monitoring of 18650 4S Packs With a Single-Point Impedance Diagnostic. Journal of Power Sources, Oct. 2014, 266:512-519.

Lu et al. A review on the key issues for lithium-ion battery management in electric vehicles. Journal of Power Sources, Mar. 2013, 226:272-288.

Mingant et al. Towards onboard Li-ion battery state-of-health diagnosis by a virtual sensor. World Electric Vehicle Journal, May 2012, 5(2):405-411.

Novak. Developing an advanced, predictive battery health monitoring solution with a low-cost microcontroller solution. Texas Instruments, White Paper, Sep. 2012, 6 pages.

Noworolski et al. Reducing and Utilizing Electrical Noises for Battery Monitoring Purposes. IEEE 32-4 (Sep. 2004), pp. 511-614.

Okoshi et al. Battery condition monitoring (BCM) technologies about lead-acid batteries. Journal of Power Sources, Aug. 2006, 158(2):874-878.

Pastor-Fernandez et al. A Comparison between EIS and IC-DV as Li-ion Diagnostic Techniques to Identify and Quantify the Effects of Degradation Modes within BMS. Journal of Power Sources, Aug. 2017, 360:301-318.

Pastor-Fernandez et al. A Study of Cell-to-Cell Interactions and Degradation in Parallel Strings: Implications for the Battery Management System. Journal of Power Sources, Oct. 2016, 329:574-585.

PEREZ e t al. Guidelines for the characterization of the internal impedance of lithium-ion batteries in PHM algorithms. International Journal of Prognostics and Health Management, Apr. 2018, ISSN 2153-2648, 11 pages.

Piret et al. Tracking of electrochemical impedance of batteries. Journal of Power Sources, Apr. 2016, 312:60-69.

Pop et al. State-of-the-art of battery state-of-charge determination. Measurement Science and Technology, Dec. 2005, 16(4) R93-R110.

Qnovo. Fundamentals of Qnovo Adaptive Charging in Lithium Ion Batteries. http://qnovo.com/wp-content/uploads/2015/12/Qvovo_TechWhitePaper_v2.4.pdf, Dec. 2015, 13 pages.

Rahmoun et al. Determination of the Impedance of Lithium-Ion Batteries using Methods of Digital Signal Processing. Energy Procedia, Dec. 2014, 46:204-213.

Raijmakers et al. Crosstalk Interferences on Impedance Measurements in Battery Packs. IFAC-PapersOnline, Jun. 2016, 49(11):042-047.

Saha et al. Comparison of Prognostic Algorithms for Estimating Remaining Useful Life of Batteries. Transactions of the Institute of Measurement and Control, Jun. 2009, 31(3), 10 pages.

(56) References Cited

OTHER PUBLICATIONS

Saha et al. Prognostics Methods for Battery Health Monitoring Using a Bayesian Framework. IEEE Transactions on Instrumentation and Measurement, Feb. 2009, 58(2):291-296.
Salehen et al. Development of battery management systems (BMS) for electric vehicles (EVs) in Malaysia. MATEC Web of Conferences, Jan. 2017, 90(11):01001, 8 pages.
Sazhin et al. Enhancing Li-Ion Battery Safety by Early Detection of Nascent Internal Shorts. Journal of The Electrochemical Society, Jan. 2017, 164(1):A6281-A6287.
Schweiger et al. Comparison of Several Methods for Determining the Internal Resistance of Lithium Ion Cells. Sensors, Jun. 2010, 10(6):5604-5625.
Singh et al. Fuzzy logic modeling of EIS measurements on lithium-ion batteries. Electrochimica Acta, Jan. 2006, 51(8):1673-1679.
Socher et al. Improving the functional safety of automotive batteries using in-situ impedance spectroscopy. Transportation Research Procedia, Dec. 2016, 14:3661-3666.
Srivastav et al. State-of-charge indication in Li-ion batteries by simulated impedance spectroscopy. J Appl Electrochem, Feb. 2017, 47(2):229-236.
Sternad et al. Condition monitoring of Lithium-Ion Batteries for electric and hybrid electric vehicles. Elektrotechnik & Informationstechnik, May 2009, 126(5):186-193.
Stroe et al. Diagnosis of Lithium-Ion Batteries State-of-Health based on Electrochemical Impedance Spectroscopy Technique. Proceedings of the 2014 Energy Conversion Congress and Exposition (ECCE) IEEE Press, Sep. 2014, pp. 1576-4582.
Jespersen et al. Capacity Measurements of Li-Ion Batteries using AC Impedance Spectroscopy. EVS24 International Battery, Hybrid and Fuel Cell Electric Vehicle Symposium, May 2009, in: 2009 World Electric Vehicle Journal, 3(1):0127-0133.
Jiang et al. Electrochemical impedance spectra for lithium-ion battery ageing considering the rate of discharge ability. Energy Procedia, May 2017, 105:844-849.
Kiel et al. Extensive Validation of A Nonintrusive Continuous Battery Monitoring Device. Battcon 2008, in: Proc. BattCon Conference May 2008, pp. 18-1-18-10.
Mingant et al. Novel state-of-health diagnostic method for Li-ion battery in service. Applied Energy, Elsevier, Dec. 2016, 183:390-398.
Perez et al. Guidelines for the Characterization of the Internal Impedance of Lithium-Ion Batteries in PHM Algorithms. International Journal of Prognostics and Health Management, Apr. 2018, 9, 11 pages.
Remy et al. Qualification and Life Testing of Li-ion VES16 Batteries. E3S Web of Conferences 16, Jan. 2017, 8 pages.
Seo et al. Detection of internal short circuit in Li-ion battery by estimating its resistance. Proceedings of the 4th IIAE International Conference on Intelligent Systems and Image Processing, Jan. 2016, 6 pages.
Taberna et al. Electrochemical Characteristics and Impedance Spectroscopy Studies of Carbon-Carbon Supercapacitors. Journal of the Electrochemical Society, Jan. 2003, 150(3):A292-A300.
Tachibana et al. Development of in situ a.c. impedance measurement system under constant-current conditions and its application to galvanostatic discharge of electrolytic manganese dioxide in alkaline solution. Journal of Power Sources, Jul. 1998, 74(1):29-33.
Tang et al. Temperature Dependent Performance and in Situ AC Impedance of High-Temperature PEM Fuel Cells Using the Nafion-112 Membrane. Journal of The Electrochemical Society, Sep. 2006, 153(11):A2036-A2043.
Varnosfaderani et al. A Comparison of Online Electrochemical Spectroscopy Impedance Estimation of Batteries. IEEE Access, Feb. 2018, vol. 6, pp. 23668-23677.
Verizon. Verizon NEBSTM Compliance: Qualification Requirements for Lithium Ion (Li-ion) Cells Batteries and Battery Strings. Verizon Technical Purchasing Requirements VZ.TPR.9810, Sep. 2015, Issue 1, 29 pages.
Waligo et al. A Comparison of the Different Broadband Impedance Measurement Techniques for Lithium-Ion Batteries. Energy Conversion congress and Exposition (ECCE), IEEE (Sep. 2016), 7 pages.
Waters. Monitoring the state of health of VRLA batteries through ohmic measurements. Proceedings of Power and Energy Systems in Converging Markets, Oct. 1997, 6 pages.
Weng et al. On-board state of health monitoring of lithium-ion batteries using incremental capacity analysis with support vector regression. Journal of Power Sources, Aug. 2013, 235:36-44.
Wu et al. A Review on Fault Mechanisms and Diagnosis Approach for Li-Ion Batteries. Journal of Nanomaterials, Oct. 2015, vol. 2015, Article ID 631263, 10 pages.
Xing et al. Battery Management Systems in Electric and Hybrid Vehicles. Energies, Oct. 2011, 4(11):1840-1857.
Xing et al. Prognostics and Health Monitoring for Lithium-ion Battery. Proceedings of the IEEE International Conference on Intelligence and Security Informatics, Jul. 2011, pp. 242-247.
Yamada et al. The intelligent automotive battery, 'CYBOX'. Journal of Power Sources, Dec. 2008, 185(2):1478-1483.
Yoo et al. An Electrochemical Impedance Measurement Technique Employing Fourier Transform. Analytical Chemistry, May 2000, 72(9):2035-2041.
Zechang et al. Battery Management Systems in the China-made 'Start' series FCHVs. IEEE Vehicle Power and Propulsion Conference (VPPC) (Sep. 2008) 6 pages.
Zenati et al. Estimation of the SOC and the SOH of li-ion batteries, by combining impedance measurements with the fuzzy logic inference. Proceedings of the 36th Annual Conference of IEEE Industrial Electronics, Nov. 2010, pp. 1767-1772.
Zhai et al. The Application of the EIS in Li-ion Batteries Measurement. Journal of Physics: Conference Series, Oct. 2006, 48(1):1157-1161.
Zhang et al. Cycling degradation of an automotive LiFePO4 lithium-ion battery. Journal of Power Sources, Feb. 2011, 196(3):1513-1520.
Zhang et al. Prediction of Lithium-Ion Battery's Remaining Useful Life Based on Relevance Vector Machine. SAE Int. J. All. Power, May 2016, 5(1):30-40.
Zhang et al. Remote Vehicle State of Health Monitoring and Its Application to Vehicle No-Start Prediction. 2009 IEEE Autotestcon, Oct. 2009, pp. 88-93.
Zhu et al. PSpice Simulation via AC Impedance for PEFC at Operational Loads. http://folk.ntnu.no/skoge/prosl/proceedings/aiche-2005/topical/pdffiles/T1/papers/215c.pdf, 2005, 3 pages.
Zhu et al. In-Situ Electrical Characterization of PEM Fuel Cells at Load. American Institute of Chemical Engineers, 2007, 5 pages.
Zhu et al. In-Stu Assessment of PEM Fuel Cells via AC Impedance at Operational Loads. http://folk.ntnu.no/skoge/prost/proceedings/aiche-2004/pdffiles/papers/014g.pdf, 2004, 5 pages.
Zou et al. Combined State of Charge and State of Health estimation over lithium-ion battery cell cycle lifespan for electric vehicles. Journal of Power Sources, Jan. 2015, 273:793-803.
Morrison, W.H., Development and Implementation of a Calibration Procedure for Complex Impedance Spectrum Measurements with Applications to Embedded Battery Health Monitoring and Management Systems, University of Connecticut Master's Theses 353, 2012, digitalcommons.uconn.edu/gs_theses/353, Hartford, Connecticut.
Naligo, A., Barendse, P., A comparison of the Different Broadband Impedance Measurement Techniques for Lithium-ion Batteries, IEEE Energy Conversion Congress and Exposition (ECCE), Sep. 2016.
Solartron Analytical, 1260A Impedance / Gain-Phase Analyzer (2017); Website, https://www.ameteksi.com, 2 pages, originally downloaded Apr. 19, 2019.
U.S. Appl. No. 15/497,142, filed Apr. 25, 2017.
U.S. Appl. No. 62/331,730, filed May 4, 2016.
U.S. Appl. No. 62/326,923, filed Apr. 25, 2016.
U.S. Department of Energy. Battery Calendar Life Estimator Manual: Modeling and Simulation. U.S. Department of Energy Vehicle Technologies Program, Revision 1, Oct. 2012, INL-EXT-08-15136, 84 pages.

(56) References Cited

OTHER PUBLICATIONS

Aglzim et al. Characterization of the Resistance of a Fuel Cell on Load by Electrochemical Impedance Spectroscopy. Proceedings from the EUROCON Conference, IEEE 2007, pp. 1489-1492.
Albrecht. Battery Complex Impedance Identification with Random Signal Techniques. MS Thesis, Montana Tech of the University of Montana, May 2005, 99 pages.
Ashtiani. Battery Hazard Modes and Risk Mitigation Analysis. USABC Version 0.0, Aug. 2007, 10 pages.
Bald. Rapid Impedance Measurements for 50-V Battery Modules. Montana Tech MS Thesis, 2012, 115 pages.
U.S. Department of Energy. Battery Test Manual For 12 Volt Start/Stop Vehicles, U.S. Department of Energy Vehicle Technologies Program, INL/EXT-12-26503, Revision 1, May 2015, 67 pages.
U.S. Department of Energy. Battery Test Manual For 48 Volt Mild Hybrid Electric Vehicles, U.S. Department of Energy Vehicle Technologies Program, INL/EXT-15-36567, Revision 0, Mar. 2017, 70 pages.
U.S. Department of Energy. Battery Test Manual for Plug-In Hybrid Electric Vehicles, U.S. Department of Energy Vehicle Technologies Program, INL/EXT-14-32849, Revision 3, Sep. 2014, 83 pages.
Belt et al. Calendar and PHEV cycle life aging of high-energy, lithium-ion cells containing blended spinel and layered-oxide cathodes. Journal of Power Sources, Dec. 2011, 196(23):10213-10221.
Bloom et al. An Investigation of the Impedance Rise and Power Fade in High-Power Li-Ion Cells. 19th International Electric Vehicle Symposium (EVS-19), Oct. 2002, 14 pages.
Chan. Swept Sine Chirps for Measuring Impulse Response. Application Note, Stanford Research Systems Inc., 2010, https://thinksrs.com/downloads/pdfs/applicationnotes/SR1_SweptSine.pdf.
Chen et al. Sinusoidal-Ripple-Current Charging Strategy and Optimal Charging Frequency Study for Li-Ion Batteries. IEEE Transactions on Industrial Electronics, Jan. 2013, 60(1):88-97.
Cho et al. Battery Impedance Analysis Considering DC Component in Sinusoidal Ripple-Current Charging. IEEE Transactions on Industrial Electronics, Mar. 2016, 63(3):1561-1573.
Christophersen et al. Battery Technology Life Verification Testing and Analysis. Idaho National Laboratory INL/CON-07-12282, Dec. 2007, 12 pages.
Christophersen et al. Performance Evaluation of Gen3 Advanced Technology Development Cells. 214th ECS Meeting, Abstract #549, The Electrochemical Society, 2008, 1 page.
Christophersen et al. Pulse resistance effects due to charging or discharging of high-power lithium-ion cells: A path dependence study. Journal of Power Sources, Nov. 2007,173(2):998-1005.
Christophersen et al. Advanced Technology Development Program for Lithium-Ion Batteries: Gen 2 Performance Evaluation Final Report. INL/EXT-05-00913, Jul. 2006, 140 pages.
Christophersen et al. Crosstalk Compensation for a Rapid, Higher-Resolution Impedance Spectrum Measurement. Aerospace Conference, 2012 IEEE, Mar. 2012, 16 pages.
Christophersen et al. Effects of Reference Performance Testing during Aging Using Commercial Lithium-ion Cells. J. Electrochem Soc., May 2006, 153(7):A1406-A1416.
Christophersen et al. Electrochemical Impedance Spectroscopy Testing on the Advanced Technology Development Program Lithium-ion Cells. Sep. 2002, IEEE Trans. Veh. Technol., 56(3):1851-1855.
Christophersen et al. Long-Term Validation of Rapid Impedance Spectrum Measurements as a Battery State-of-Health Assessment Technique. SAE Int. J. Alt. Power, May 2013, 6(1):146-155.
Christophersen et al. Lumped Parameter Modeling as a Predictive Tool for a Battery Status Monitor. Oct. 2003, Proceedings from IEEE Vehicular Technology Conference, 6 pages.
Christophersen et al. Rapid Impedance Spectrum Measurements for State-of-Health Assessment of Energy Storage Devices. SAE Int. J. Passeng. Cars—Electron. Electr. Syst., Apr. 2012, 5(1), 11 pages.
Christophersen et al. Impedance Noise Identification for State-of-Health Prognostics. 43rd Power Sources Conference, Jul. 2008, 4 pages.
Christopherson. Battery Test Manual For Electric Vehicles. Idaho National Laboratory, U.S. Department of Energy Vehicle Technologies Program, INL/ EXT-15-34184, Revision 3, Jun. 2015, 67 pages.
Delaille et al. Study of the 'coup de foue7' of lead-acid cells as a function of their state-of-charge and state-of-health. Journal of Power Sources, Aug. 2006,158(2):1019-1028.
Din et al. A Scalable Active Battery Management System With Embedded Real-Time Electrochemical Impedance Spectroscopy. IEEE Transactions on Power Electronics, Jul. 2017, 32(7):5688-5698.
Din et al. Online Spectroscopic Diagnostics Implemented in an Efficient Battery Management System. 16th Workshop on Control and Modeling for Power Electronics, 2015, 7 pages.
Doan et al. Intelligent Charger with Online Battery Diagnosis Function. 9th International Conference on Power Electronics-ECCE Asia, Jun. 2015, pp. 1644-1649.
Doughty et al. FreedomCAR Electrical Energy Storage System Abuse Test Manual for Electric and Hybrid Electric Vehicle Applications. SAND2005-3123, Aug. 2006, 46 pages.
Egloff et al. A Critical Analysis of an Instrumentation Current Sources. 59th International Instrumentation Symposium, May 2013, 12 pages.
Fasmin et al. Review—Nonlinear Electrochemical Impedance Spectroscopy. Journal of The Electrochemical Society, May 2017, 164(7):H443-H455.
Fenton et al. BSM Development Documentation Senior Project Final Report for the Idaho National Laboratory. May 2005, Montana Tech of the University of Montana, 21 pages.
Ford, Jr. Validation of Push Pull Current. Proceedings of the Annual Montana Tech Electrical and General Engineering Symposium, Jan. 2016, 25 pages.
Garcia et al. On-line State-of-Health and Remaining-Useful-Life Assessment of Batteries using Rapid Impedance Spectrum Measurements. 45th Power Sources Conference Proceedings, Jun. 2012, 7.3, pp. 115-118.
Haskins et al. Battery Technology Life Verification Test Manual. Idaho National Laboratory, Feb. 2005, INEEL/EXT-04-01986, 133 pages.
Hirschorn et al. On Selection of the Perturbation Amplitude Required to Avoid Nonlinear Effects in Impedance Measurements. Israel Journal of Chemistry, 2008, vol. 48, pp. 133-142.
Hoffmann et al. Development and Test of a Real Time Battery Impedance Estimation System. IEEE Aerospace 2006 Conference, Mar. 2006, IEEE 0-7803-9546-8/06, 8 pages.
Huet. A review of impedance measurements for determination of the state-of-charge or state-of-health of secondary batteries. Journal of Power Sources, Jan. 1998, 70(1):59-69.
Morrison et al. An Advanced Calibration Procedure for Complex Impedance Spectrum Measurements of Advanced Energy Storage. 58th International Instrumentation Symposium, Jun. 2012, INL/CON-12-24519, 17 pages.
Morrison et al. Fast Summation Transformation for Battery Impedance Identification. IEEE Aerospace Conference, Mar. 2009, 9 pages.
Morrison et al. Real Time Estimation of Battery Impedance. IEEE Aerospace Conference, Mar. 2006, 13 pages.
Morrison. DC Buffering and Floating Current for a High Voltage IMB Application. INL/EXT-14-32858, Aug. 2014, 8 pages.
Morrison. Development and Implementation of a Calibration Procedure for Complex Impedance Spectrum Measurements with Applications to Embedded Battery Health Monitoring and Management Systems. University of Connecticut Master's Thesis, 2012, 119 pages.
Morrison. Signals and Systems: State Variable Description of Linear Time Invariant Systems. Montana Tech Digital Commons, Sep. 2013, Chapter 17, pp. 198-216.
Morrison. Signals and Systems: Synchronous Detection. Montana Tech Digital Commons, Sep. 2013, Chapter 20, pp. 243-246.
Motloch et al. High-Power Battery Testing Procedures and Analytical Methodologies for HEV's. 7, SAE Int. Passenger Cars Electron. Electr. Syst., vol. 111 (2002), pp. 797-802.

(56) References Cited

OTHER PUBLICATIONS

Nikolopoulos et al. Accurate Method of Representation of High-Voltage Measuring Systems and its Application in High-Impulse-Voltage Measurements. IEEE, Mar. 1989, 136(2):66-72.
Piller et al. Methods for state-of-charge determination and their applications. Journal of Power Sources, Jun. 2001, 96(1):113-120.
Qahouq et al. Single-Perturbation-Cycle Online Battery Impedance Spectrum Measurement Method With Closed-Loop Control of Power Converter. IEEE Transactions on Industrial Electronics, Sep. 2017, 64(9):7019-7029.
Qahouq. Online Battery Impedance Spectrum Measurement Method. IEEE Applied Power Electronics Conference and Exposition, Mar. 2016, pp. 3611-3615.
Ramos et al. Comparison of impedance measurements in a DSP using ellipse-fit and seven-parameter sine-fit algorithms. Measurement, May 2009, 42(9):1370-1379.
Ran et al. Prediction of State of Charge of Lithium-ion Rechargeable Battery with Electrochemical Impedance Spectroscopy Theory. 5th IEEE Conference on Industrial Electronics and Applications, Jul. 2010, pp. 684-688.
Ranade et al. An overview of harmonics modeling and simulation, Tutorial on Harmonics Modeling and Simulation. IEEE Power Engineering Society, 1998, Chapter 1, 7 pages.
Ranieri et al. Electronic Module for the Thermal Monitoring of a Li-ion Battery Cell through the Electrochemical Impedance Estimation. 22nd International Workshop on Thermal Investigations of ICs and Systems, Sep. 2016, pp. 294-297.
Smith et al. Model Validation Approaches for Nonlinear Feedback Systems Using Frequency Response Measurements. IEEE Proceedings of the 38th IEEE Conference on Decision and Control, Dec. 1999, vol. 2, pp. 1500-1504.
Smyth. Development of a Real Time Battery Impedance Measuring System. M.S. Thesis, Montana Tech of the University of Montana, 2008, 128 pages.
Thomas et al. Statistical methodology for predicting the life of lithium-ion cells via accelerated degradation testing. Journal of Power Sources, Sep. 2008, 184(1):312-317.
Unkflhaeuser et al. Electrochemical Storage System Abuse Test Procedure Manual. United States Advanced Battery Consortium, SAND99-0497, Jul. 1999, 33 pages.
Varnosfaderani et al. Online Impedance Spectroscopy Estimation of a dc-dc converter connected Battery using an Earth Leakage Monitoring Circuit. 19th European Conference on Power Electronics and Applications, Sep. 2017, pp. P.1-P.10.
Verbrugge et al. Adaptive state of charge algorithm for nickel metal hydride batteries including hysteresis phenomena. Journal of Power Sources, Feb. 2004, 126(1-2):236-249.
Verbrugge. Adaptive, multi-parameter battery state estimator with optimized time-weighting factors. J Appl Electrochem, May 2007, 37(5):605-616.
Wang et al. State Estimation of Lithium ion Battery Based on Electrochemical Impedance Spectroscopy with On-board Impedance Measurement System. IEEE Vehicle Power and Propulsion Conference, Oct. 2015, 5 pages.
Zhu et al. PSpice Simulation via AC Impedance for PEFC at Operational Loads. http://folk.ntnu.no/skoge/prost/proceedings/aiche-2005/topical/pdffiles/T1/papers/215c.pdf, 2005, 3 pages.
Ziemer et al. Signals and Linear System Analysis, Chapter 2, pp. 16-100, in: Principles of Communications, 5th edition, John Wiley & Sons.
Solartron Analytical. 1260 Impedance/Gain-Phase Analyzer. Operating Manual, Jan. 1996, 215 pages.
Solartron Analytical. 1287 Electrochemical Interface, User Guide, Aug. 2002, 134 pages.
Ineel. FreedomCAR Battery Test Manual for Power-Assist Hybrid Electric Vehicles. Oct. 2003, DOE/ID-11069, 130 pages.
Ineel. FreedomCAR Ultracapacitor Test Manual. DOE/ID-11173, Revision 0, Sep. 2004, 116 pages.
Idaho National Laboratory. Battery Test Manual for Plug-In Hybrid Electric Vehicles, INL/EXT-07-12536, Revision 0, Mar. 2008, 68 pages.
Idaho National Laboratory. Battery Test Manual for Plug-In Hybrid Electric Vehicles, INL/EXT-07-12536, Revision 2, Dec. 2010, 71 pages.
Katayama et al. Real-Time Electrochemical Impedance Diagnosis for Fuel Cells Using a DC-DC Converter. IEEE Transactions on Energy Conversion, Jun. 2015, 30(2):707-713.
Koch et al. Electrochemical Impedance Spectroscopy for Online Battery Monitoring—Power Electronics Control. 16th European Conference on Power Electronics and Applications, 2014, 10 pages.
Koch et al. Impedance Spectroscopy for Battery Monitoring with Switched Mode Amplifiers. 16th International Power Electronics and Motion Control Conference and Exposition, Sep. 2014, pp. 496-501.
Koch et al. On-line Electrochemical Impedance Spectroscopy Implementation for Telecommunication Power Supplies. IEEE International Telecommunications Energy Conference, 2015, 6 pages.

\* cited by examiner

FIG. 1 shunt 500mA TC #3 500mA

FIG. 2 shunt 500mA TC #3 250mA

FIG. 3 shunt 500mA TC #3 125mA

FIG. 4 shunt 500mA TC #3 62.5mA

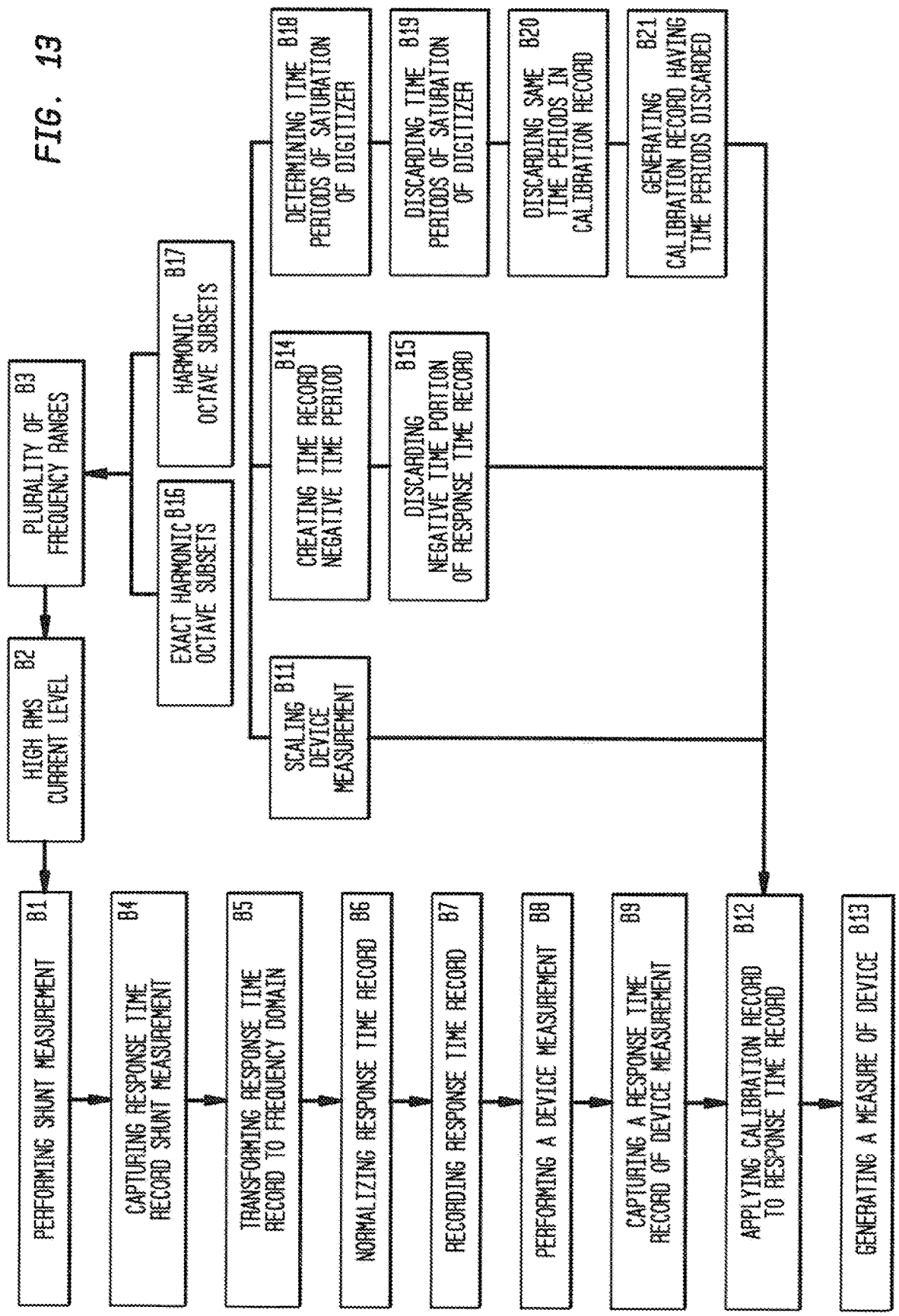

METHOD OF CALIBRATING IMPEDANCE MEASUREMENTS OF A BATTERY

This United States patent application is a continuation of U.S. patent application Ser. No. 16/852,231, filed Apr. 17, 2020, now U.S. Pat. No. 10,942,240, issued Mar. 9, 2021, which is a continuation of U.S. patent application Ser. No. 16/432,822, filed Jun. 5, 2019, now U.S. Pat. No. 10,656,233, issued May 19, 2020, which is a continuation of U.S. patent application Ser. No. 15/497,142, filed Apr. 25, 2017, now U.S. Pat. No. 10,436,873, issued Oct. 8, 2019, which claims the benefit of U.S. Provisional Patent Application No. 62/331,730, filed May 4, 2016, and U.S. Provisional Patent Application No. 62/326,923, filed Apr. 25, 201, the disclosures of which are hereby incorporated by reference in their entirety including all figures, tables and drawings.

BACKGROUND OF THE INVENTION

Batteries and other electrical energy storage devices have become widely used in not only military, space, and commercial applications but also in domestic applications. Therefore, it has become even more important to be able to efficiently and effectively obtain an accurate estimation of the battery's state-of-health. While voltage, current, and temperature may be used to gauge the remaining capacity of a battery, in critical applications it is also necessary to know impedance and power capability to get an accurate picture of battery health. Ideally, any measurement of battery health is done in-situ and has minimal impact on the battery. A great deal of work has been conducted to test battery impedance without effecting battery status. This work is documented in, for example, U.S. Pat. Nos. 7,688,036; 7,395,163 B1; 7,675,293 B2; 8,150,643 B1; 8,352,204 B2; 8,762,109 B2; 8,868,363 B2; and 9,244,130 B2, and U.S. Published Patent Application Nos. 2011/0270559 A1; 2014/0358462 A1; and 2017/0003354 A1. Each variation of the methods described in these documents improve the process of assessing battery health by, for example, increasing resolution. Recently, a method for testing battery impedance has been described that increases the resolution of a known system by a factor of ten. Key features of this high resolution method involve a new algorithm, auto-ranging to obtain the optimum level of excitation current, and increased preamplifier gain. The method also required an additional measurement channel that captures time records of the Sum-Of-Sines (SOS) current in addition to the SOS voltage from the test battery.

Although the above-methods have refined this important process, an improved method for calibration that will greatly simplify the calibration process and eliminate the extra measurement channel needed for some methods is still needed.

All patents, patent applications, provisional patent applications and publications referred to or cited herein, are incorporated by reference in their entirety to the extent they are not inconsistent with the teachings of the specification.

SUMMARY OF THE INVENTION

The invention involves an improved method of calibrating impedance measurements of a battery. The method needs only a single measurement with a known Sum of Sines (SOS) current, at the desired frequency spread and known root mean squared (RMS) current.

BRIEF DESCRIPTION OF THE SEVERAL VIEWS OF THE DRAWINGS

FIG. 13 is a block flow diagram of a method for generating a measure of impedance of a test device.

DETAILED DESCRIPTIONS OF THE INVENTION

Figure 1:
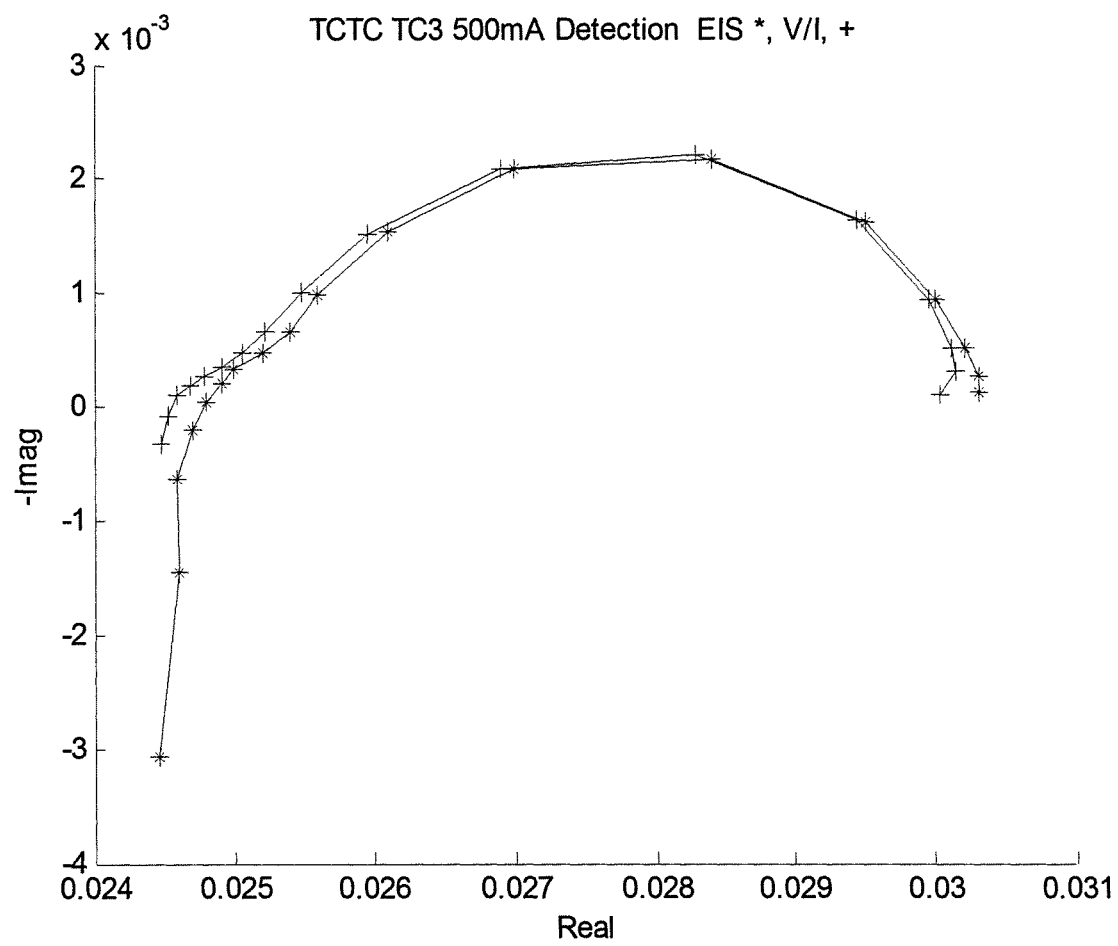
FIG. 1 shows the single shunt calibration of a test cell at 500 mA using the method of the subject invention.
Figure 2:
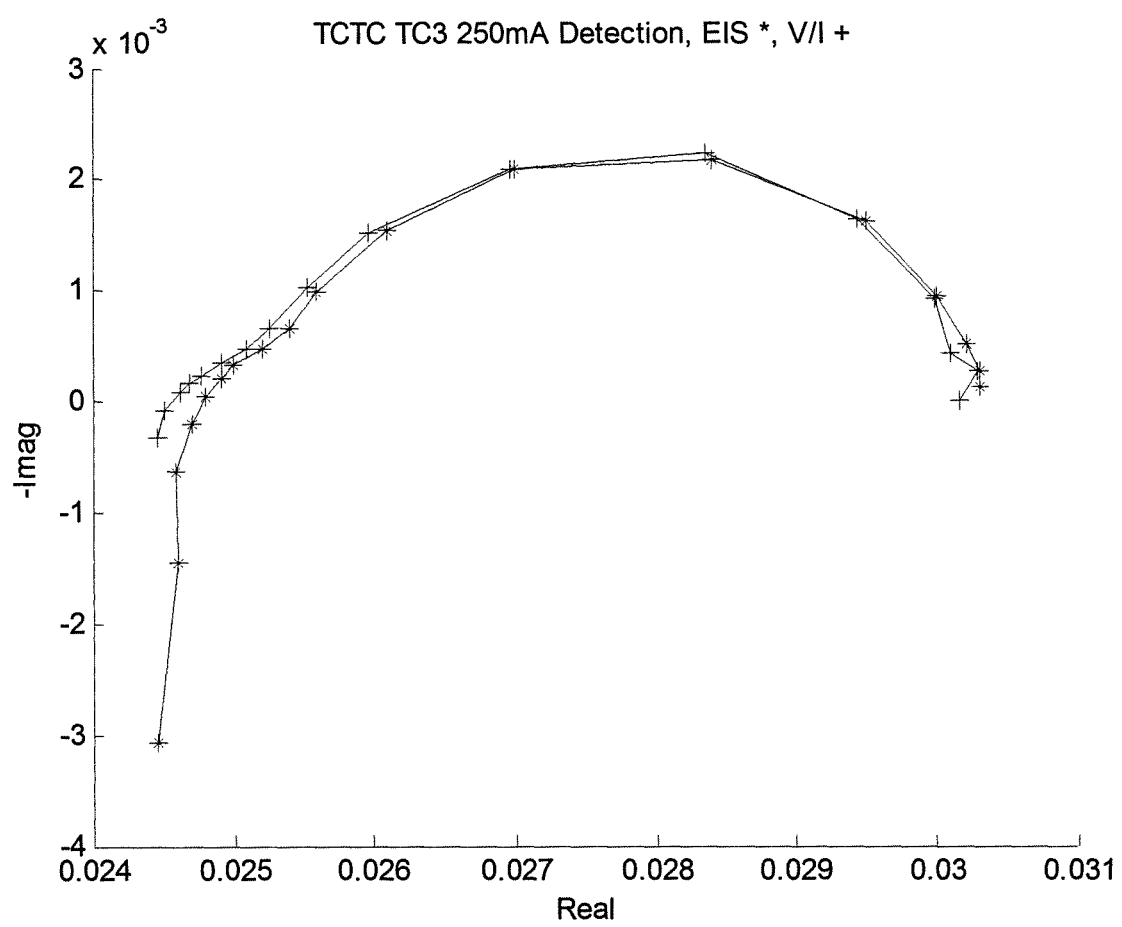
FIG. 2 shows the single shunt calibration of a test cell with RMS current scale 500 mA down to 250 mA using the method of the subject invention.
Figure 3:
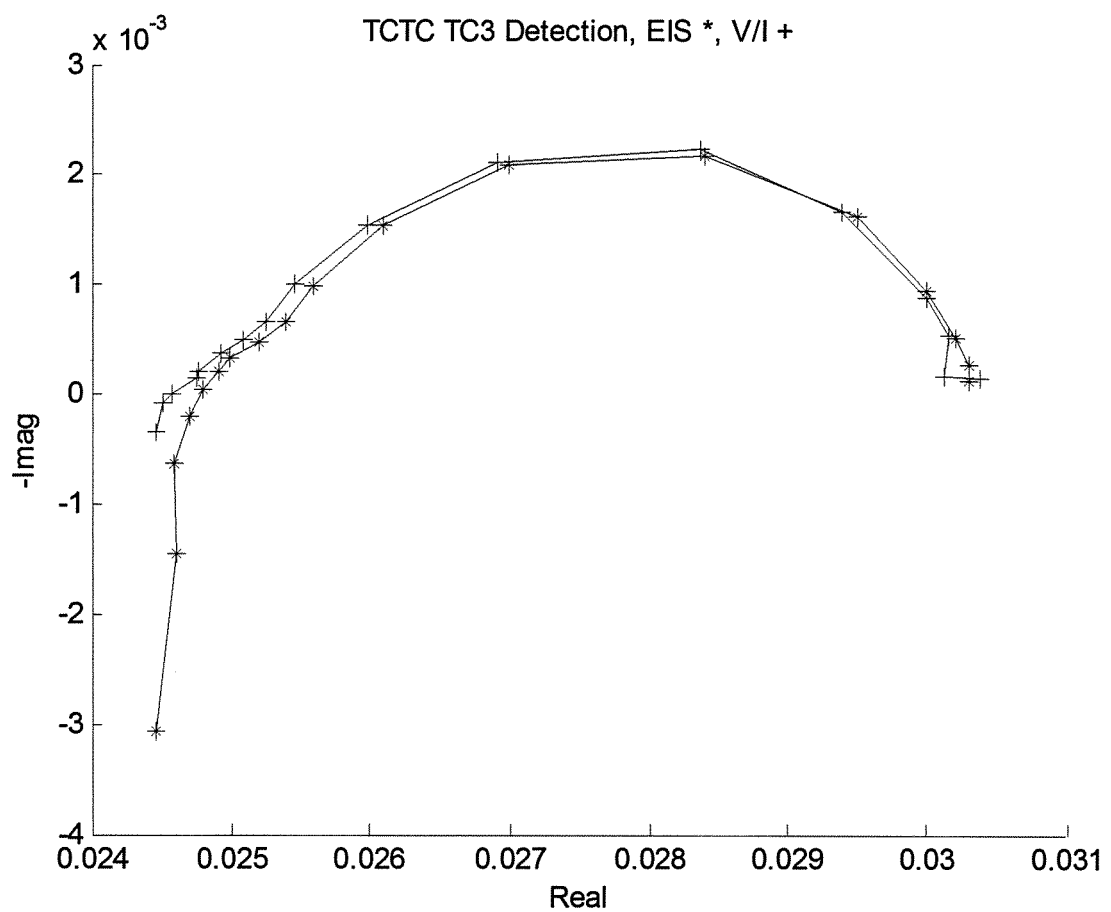
FIG. 3 shows the single shunt calibration of a test cell with RMS current scale 500 mA down to 125 mA using the method of the subject invention.
Figure 4:
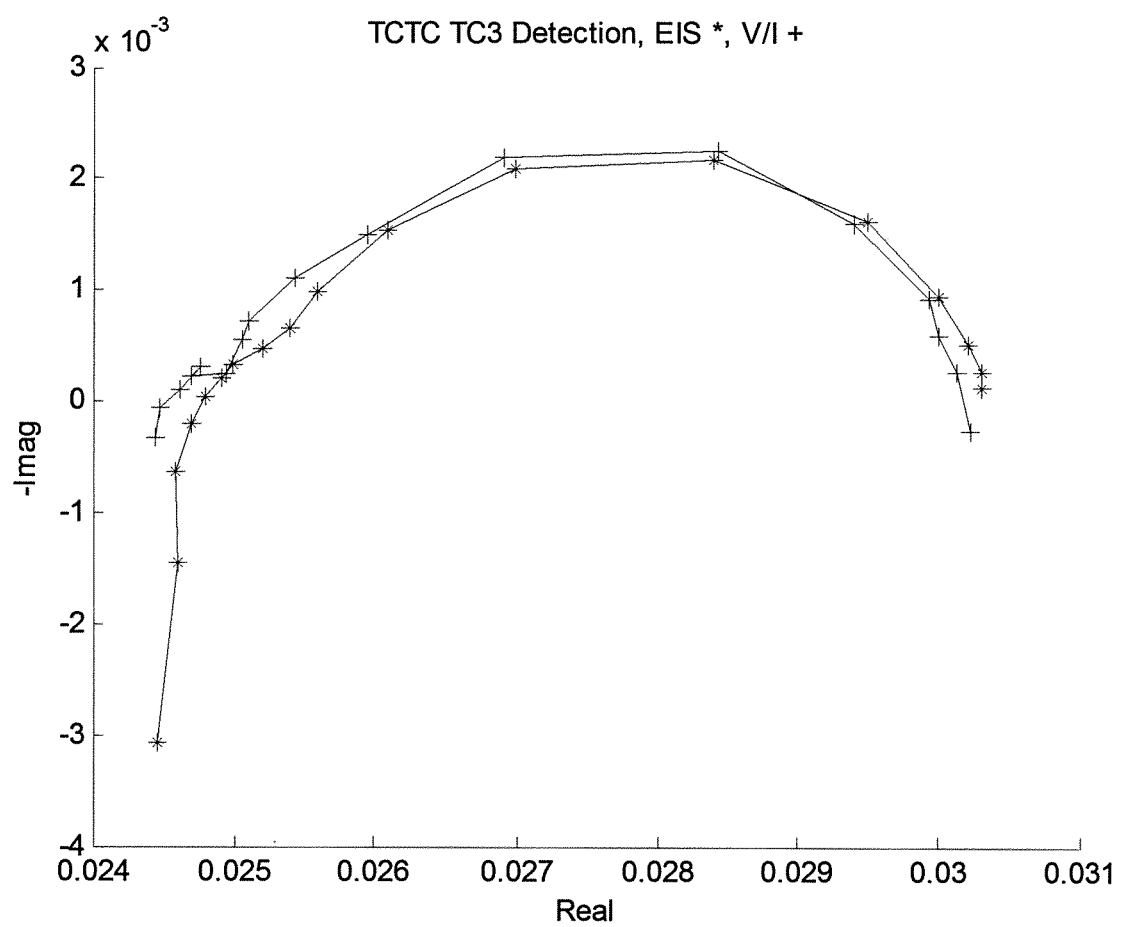
FIG. 4 shows the single shunt calibration of a test cell with RMS current scale 500 mA down to 62.5 mA using the method of the subject invention.

The method of the subject invention is involves single shunt calibration (SSC) that applies to all generations of (Impedance Measurement Box) IMB. The subject method simplifies use of the IMB to assess battery health. The Idaho National Laboratory (INL) has described the design and construction of the IMB in numerous patent documents (see, for example, U.S. Pat. Nos. 7,688,036; 7,395,163 B1; 7,675,293 B2; 8,150,643 B1; 8,352,204 B2; 8,762,109 B2; 8,868,363 B2; and 9,244,130 B2, and U.S. Published Patent Application Nos. 2011/0270559 A1; 2014/0358462 A1; and 2017/0003354 A1). Spectrum algorithms used in the implementation are also described in the above patent documents and include, but are not limited to, harmonic compensated synchronous detection (HCSD), fast summation transformation (FST), generalized fast summation transformation (GFST), frequency cross talk compensation (FCTC), time cross talk compensation (TCTC), harmonic orthogonal synchronous transformation (HOST). Each of these spectrum algorithms are special cases of a rapid Fourier Transform that bring the measurement time record captured by the IMB measurement into the frequency domain at only the frequencies that were part of the IMB excitation signal to the test battery. The calibration in the present generation 50V IMB (U.S. Patent Application Publication No. 2014/0358462) is accomplished by a complicated measurement scheme which uses 3 different shunts to generate calibration constants that yield a very accurate measurement of the impedance spectra from a test battery (Morrison, William. H., thesis, 2012). In contrast, the claimed method requires only a single measurement with a known Sum Of Sines (SOS) current, at the desired frequency spread and known RMS current.

As an example consider application to the 50V IMB (U.S. Patent Application Publication No. 2014/0358462). With the present 50V IMB HCSD algorithm system (U.S. Patent Application Publication No. 2014/0358462), the calibration for a given SOS frequency spread (octave harmonic short 0.1 Hz to 1638.4 Hz or long 0.0125 Hz to 1638.4 Hz) and a given SOS RMS current, the measurement time record that is processed into the frequency domain is typically one period of the lowest frequency. As part of the calibration the SOS current output is pre-emphasized to mitigate the IMB system frequency response. Additionally, the 3 shunt calibration scheme computes gain and offset constants for both magnitude and phase at each frequency. Equation 1 represents the time record captured by the IMB from a measurement on a test battery.

$$V_B(t) = I_{SOS}(t) * A_S(t) * Z_B(t) \quad (1)$$

Where: $I_{SOS}(t)$ is the SOS current time record
$A_S(t)$ is the measurement system impulse response
$Z_B(t)$ is the test battery impedance impulse response
The * in Equation 1 is a convolution operation. Because of the calibration pre-emphasis, $I_{SOS}(t)$ is given by:

$$I_{SOS}(t) = RMS \sqrt{\frac{2}{m}} \sum_{i=1}^{m} \sin(\omega_i t) \quad (2)$$

Where: RMS is the RMS of the SOS current
m is the number of frequencies in the SOS
$\omega_i$ is the $i^{th}$ radian frequency
Note that the RMS of a SOS signal is:

$$RMS = \sqrt{\sum_{i=1}^{m} \left( \frac{1}{T_i} \int_{T_i} (V_P \sin(\omega_i t))^2 dt \right)} = V_P \sqrt{\frac{m}{2}}$$

$$V_P = RMS \sqrt{\frac{2}{m}}$$

Equations 1 and 2 brought into the frequency domain via the 50V IMB HCSD algorithm (Morrison, William H., thesis, 2012) becomes:

$$\vec{V}_{Bi} = RMS \sqrt{\frac{2}{m}} (A_{Si} \Box \phi_{Si})(Z_{Bi} \Box \phi_{Bi}) \quad (3)$$

Where: $A_{Si} \Box \phi_{Si}$ is the measurement system frequency response at the $i^{th}$ frequency $Z_{Bi} \Box \phi_{Bi}$ is the desired battery impedance at the $i^{th}$ frequency The effect of calibration is to multiply Equation 3 by a calibration constant given by:

$$CAL_i = \left( RMS \sqrt{\frac{2}{m}} (A_{Si} \Box \phi_{Si}) \right)^{-1} \quad (4)$$

Clearly the calibration applied to Equation 3 results in the desired battery impedance and the 50V IMB has demonstrated this with great success via the 3 shunt magnitude calibration and the stepped phase shift calibration both yielding gain offset calibration constants that represent Equation 4 (Morrison, William H. thesis, 2012). Observe that Equation 4 is a calibration constant that is a combination of SOS current pre-emphasis and magnitude phase calibration at each frequency. The subject method does everything in a single measurement with a single shunt, single shunt calibration (SSC).

For the 50V IMB system the concept is very simple. The system will perform a spectrum measurement on a known non-inductive shunt for example a 50 mOhm non-inductive calibration shunt (as shown in FIG. 13, Block B1). The SOS current is set to the high level, 500 mA RMS (as shown in FIG. 13, Block B2). The system must be configured for no pre-emphasis and no calibration (U.S. Patent Application Publication No. 2014/0358462). As the 50V IMB uses the HCSD algorithm, either 18 frequencies are selected, 0.0125 Hz to 1638.4 Hz or 15 frequencies 0.1 Hz to 1638.4 Hz both in octave steps (as shown in FIG. 13, Block B3). The measurement is performed and processed via the HCSD algorithm to convert the captured time record into the frequency domain (as shown in FIG. 13, Blocks B4 and B5 respectively). Then the complex results at each frequency are normalized to the measurement shunt value and the SOS RMS current (as shown in FIG. 13, Block B6). These results are in fact Equation 6 and are stored in a calibration file that when recalled can be used to calibrate a battery impedance measurement with the same frequency spread and different RMS current (as per Equation 9)(as shown in FIG. 13, Block B7).

For the single shunt calibration (SSC), we assume that single shunt used is constant and independent of frequency over the frequency range of the IMB. Additionally, all measurements are made without any pre-emphasis. Thus as a function of time the IMB measurement of that shunt $V_{SHUNT}(RMS, i\Delta t)$ is given by Equation 5.

$$V_{SHUNT}(RMS, i\Delta t) = V_{SOS}(RMS, i\Delta t) * H_{OUT}(t) * R_{SHUNT} * H_{IN}(i\Delta t) \quad (5)$$

Where *: indicates the convolution operation
$V_{SOS}(RMS, i\Delta t)$: is the computer generated signal to IMB current drivers
$H_{OUT}(t)$: is the current driver system response in time
$i\Delta t$: is the computer discrete time
$R_{SHUNT}$: is the calibration shunt, ohms
$H_{IN}(i\Delta t)$: is the IMB system input response in discrete time
Also as a function of time the IMB measurement of a test battery is given by Equation 6.

$$V_{Meas}(RMS, i\Delta t) = V_{SOS}(RMS, i\Delta t) * H_{OUT}(t) * Z_{BAT}(t) * H_{IN}(i\Delta t) \quad (6)$$

Where: $Z_{BAT}(t)$ is the impedance impulse response of the battery as a function of time.

For the SSC the time record of the shunt (Equation 5) is processed by the HCSD algorithm of the IMB, normalized by $R_{SHUNT}$ and stored as calibration. Equation 7 illustrated the shunt time record brought into the frequency domain at one of the SOS frequencies $\omega_i$.

$$V_{SHUNT}(\omega_i) = V_{SOS}(RMS,\omega_i) H_{OUT}(\omega_i) R_{SHUNT} H_{IN}(\omega_i) \quad (7)$$

Where: $\omega_i$ is radians/sec

Note that the convolution operation in Equation 5 goes to multiplication in Equation 7. The time record of the battery given by Equation 6 when brought into the frequency domain at one of the SOS frequencies $\omega_i$ is given by Equation 8.

$$V_{Meas}(\omega_i) = V_{SOS}(RMS,\omega_i) H_{OUT}(\omega_i) Z_{BAT}(\omega_i) H_{IN}(\omega_i) \quad (8)$$

Performing division in the frequency domain the essence of calibration is given by Equation 9.

$$Z_{BAT}(\omega_i) = R_{SHUNT} \frac{V_{SOS}(RMS, \omega_i) H_{OUT}(\omega_i) Z_{BAT}(\omega_i) H_{IN}(\omega_i)}{V_{SOS}(RMS, \omega_i) H_{OUT}(\omega_i) R_{SHUNT} H_{IN}(i \Delta t)} \quad (9)$$

Thus the SSC is a collection of measurements of $R_{SHUNT}$ at standardized RMS currents and SOS frequency spreads brought into the frequency domain by the HCSD algorithm. For the IMB there are 2 standardized frequency ranges and 4 standardized RMS currents. To calibrate for this, results in 8 measurements with the single shunt for SSC which are performed fully automated with a single shunt hook-up. A vast improvement over the original manual 3 shunt calibration process.

Observe Equation 7, if in addition to being normalized to the shunt if it were normalized also to the calibration RMS current it can be used as a calibration for any battery measurement RMS current by scaling it to that measurement RMS current.

Example 1—Validation Using 50V IMB and RMS Current Scaling

Figure 5:
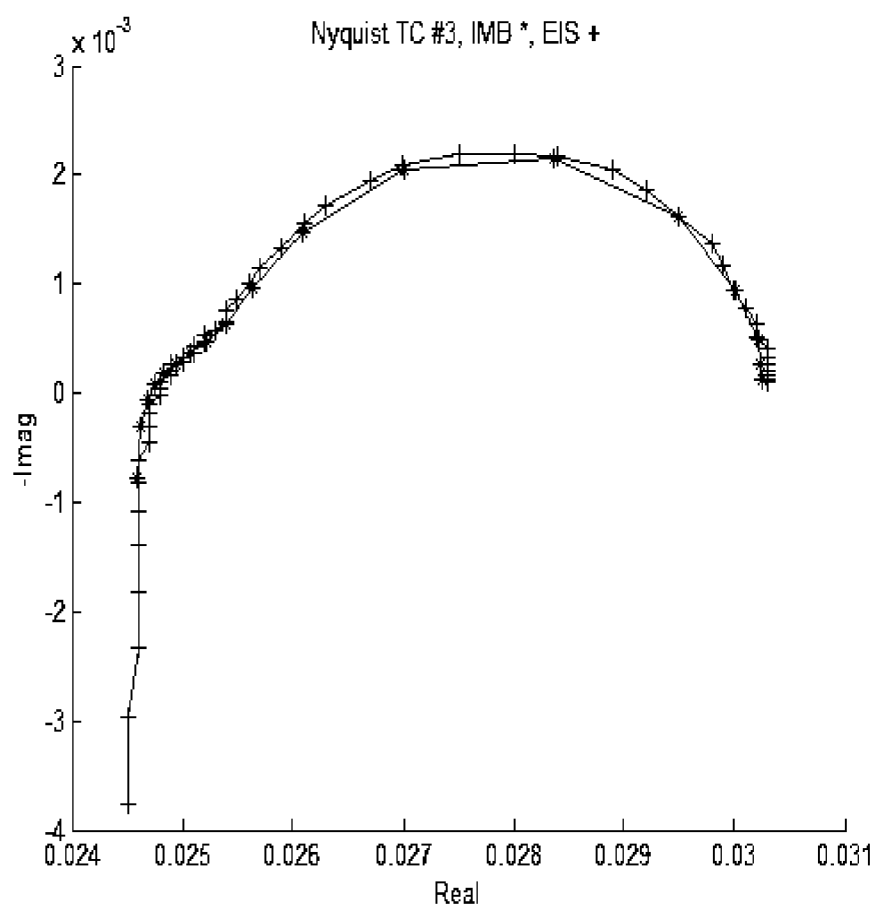
FIG. 5 shows a single shunt calibration with Solatron EIS of a test cell using the method of the subject invention.
Figure 6:
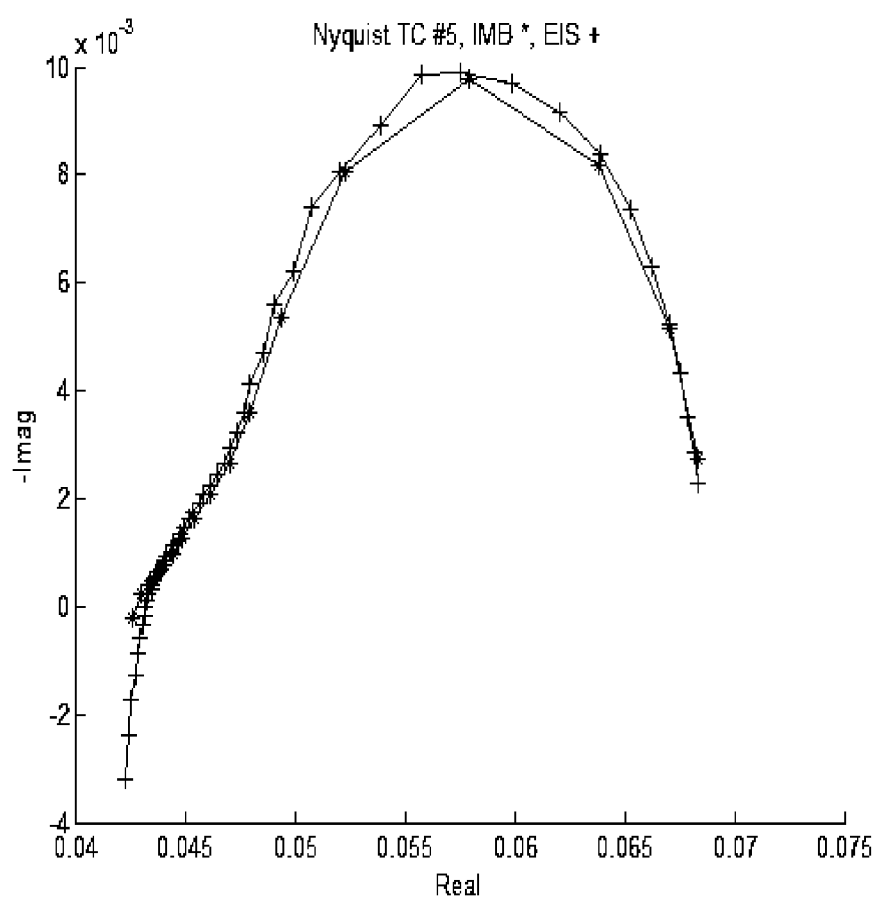
FIG. 6 shows a single shunt calibration with Solatron EIS of a test cell using the method of the subject invention.
Figure 7:
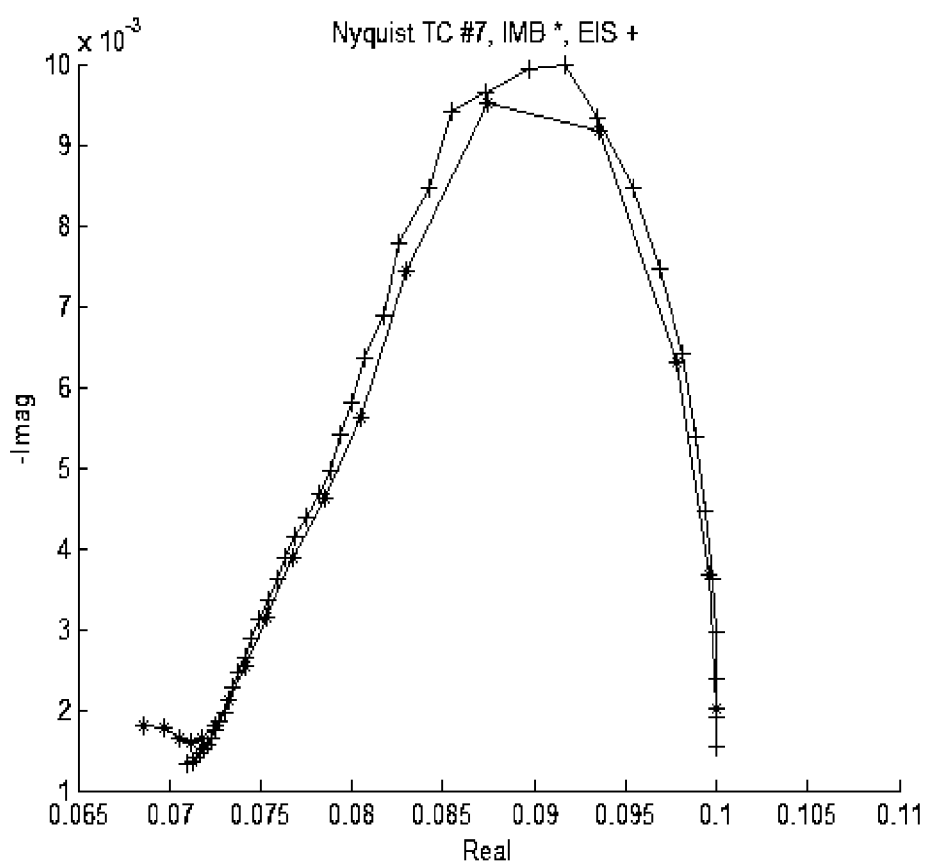
FIG. 7 shows a single shunt calibration with Solatron EIS of a test cell using the method of the subject invention).

The 50V IMB at Montana Tech of the University of Montana (Butte, Mont.) was used for initial testing. A long run frequency (0.0125 Hz to 1638.4 Hz) domain calibration file was generated (via HCSD) with-out any calibration or pre-emphasis at an SOS current of 500 mA and a 50 mOhm shunt (as shown in FIG. 13, Blocks B1-B7). It was normalized to the 50 mOhm shunt and the RMS current. Time records of measurements (long runs, 0.0125 Hz to 1638.4 Hz) were made and captured for Test Cell (TC) #3 (Morrison, William H., thesis, 2012) at RMS currents of 500 mA, 250 mA, 125 mA and 62.5 mA again without any pre-emphasis (as shown in FIG. 13, Blocks B8 and B9). All those Test Cell time records were post processed into the frequency domain with the HCSD algorithm ((as shown in FIG. 13, Block B10). The frequency domain calibration was scaled to each measurement current RMS ((as shown in FIG. 13, Block B11). Test cell measurements were made at all the different currents (of 62.5 mA, 125 mA, 250 mA and 500 mA) and calibrated per Equation 9. The results are shown in FIGS. 1-4. The detected TC #3 spectra are plotted with Electro-chemical impedance spectroscopy (EIS) (Solartron Analytical, 2012) data by INL on TC #3. The validity of the subject method is realized by the degree of coincidence of the two plots. Like results were achieved when the subject method was applied to Test Cells #3, #5, and #7. Results demonstrating SSC with these test cells are plotted and shown in FIGS. 5-7.

These results show that 500 mA shunt data can reach all the way down the 62.5 mA to capture the spectra of TC #3 and the results match closely with INL EIS (Solartron Analytical, 2012) data for TC #3 (as shown in FIG. 13, Block B12). This means that for calibration all that is needed is frequency domain files of known shunt, known frequencies and that file will work on measurements with the same frequencies and different known current with good results. This is a significant enhancement to the existing 50V IMB.

As stated previously, with the single shunt calibration, with standard RMS currents and standard frequency ranges, a calibration is fully automated with as few as 8 measurements. Never the less, that can be reduced to a single calibration measurement with frequency scaling and RMS current scaling. In examining Equation 5 for calibration it would be normalized to the calibration RMS current and the shunt value. Then for a calibration it would be scaled by the measurement RMS. Consider the RMS of an SOS:

$$RMS(SOS) = \sqrt{\left(\sum_M \frac{V_P^2}{2}\right)} = V_P \sqrt{\frac{M}{2}} \quad (10)$$

Where: M is the number of frequencies
$V_P$ is the peak voltage of the sine waves in the SOS Thus given that a measurement frequency range is an octave harmonic subset of a calibration frequency range the frequency domain the subset of real and imaginary constants are selected out and scaled per:

$$(\text{Calibration}) \times \sqrt{\frac{M_{CAL}}{M_{MEAS}}} \times \frac{RMS_{MEAS}}{RMS_{CAL}} \quad (11)$$

Example 2—Validation Test of Frequency and RMS Calibration Scaling

Figure 8:
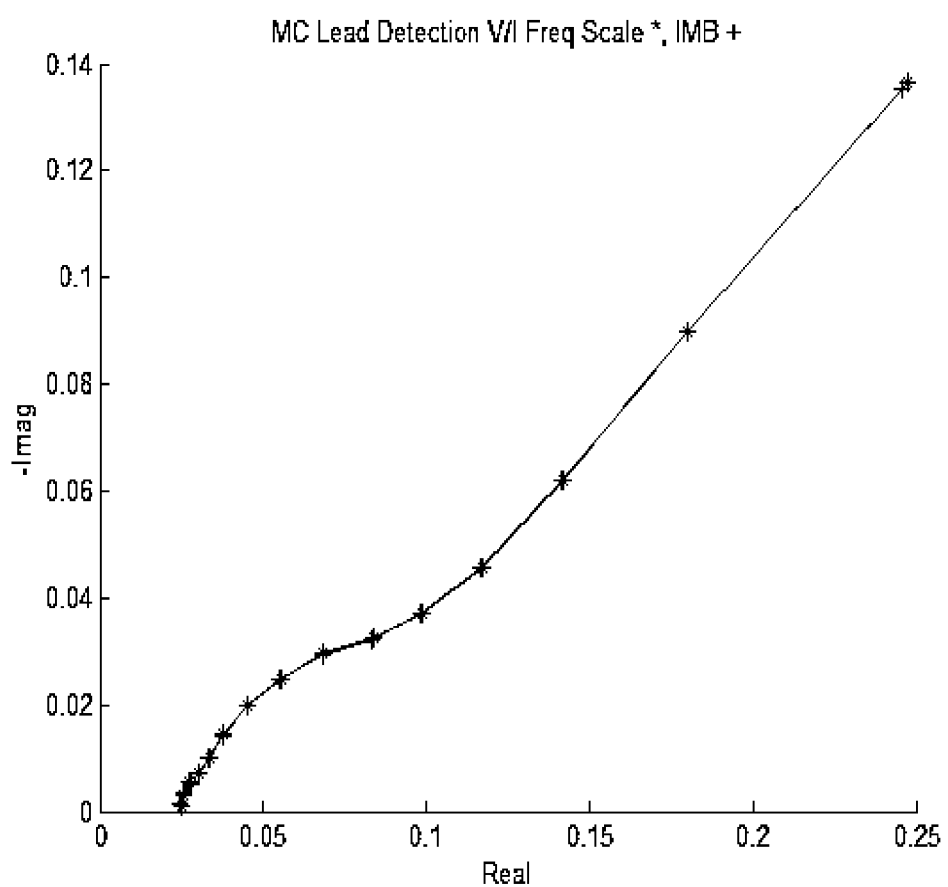
FIG. 8 shows a lead acid battery measured at 62.5 mA and 15 frequency SOS showing 18 to 15 frequency and 500 mA to 62.5 mA RMS current and frequency scaling.
Figure 9:
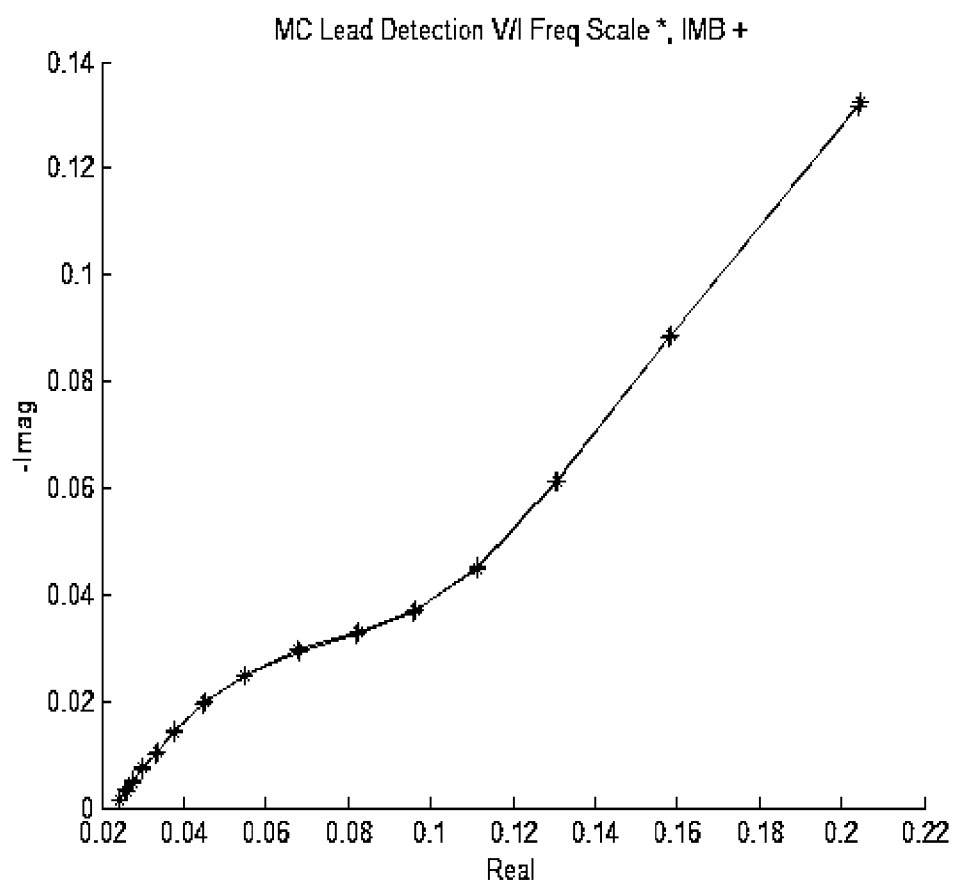
FIG. 9 shows a lead acid battery measured at 125 mA RMS SOS showing 18 to 15 frequency and 500 mA to 125 mA RMS current scaling and frequency scaling.

Small lead acid battery measured by IMB with 62.5 mA and 15 frequency SOS. IMB spectrum obtained with normal IMB calibration. Uncalibrated time record post processed to the frequency domain and calibrated by an 18 frequency 500 mA shunt time record brought to the frequency domain and scaled to 15 frequency and 62.5 mA RMS. Both spectra are given in FIG. 8. FIG. 9 shows the battery measured by IMB at 125 mA RMS SOS (as shown in FIG. 13, Block B13). These results support frequency and RMS current scaling for SSC.

Example 3—Negative Time to Reinforce the Assumption of Steady State

The fundamental assumption of all IMB data processing algorithms is that the system being measured is in steady state relative to all excitation frequencies. Clearly this is in contradiction to the requirement of performing a rapid measurement. The IMB measurement technique is to excite the test article with a sum of sinusoids with an excitation time record of no more than one period of the lowest frequency. Some researchers using the IMB measurement concept (Waligo, A., 2016) have resorted to using multiple periods of the lowest frequency in order to re-inforce this assumption. A better solution is "Negative Time" (NT), whereby the sum of sinusoids starting at time zero would all be zero but if one goes backwards in time for a fraction of the period of the lowest frequency, then start the excitation there, this has been shown to work very well to establish the steady state approximation (10% is typical) (as shown in FIG. 13, Block B14). This NT portion is either ignored or discarded from the captured voltage response (as shown in FIG. 13, Block B15). Additionally, NT is also needed for shunt calibration as smoothing filter in the IMB will need to be brought to steady state.

Figure 10:
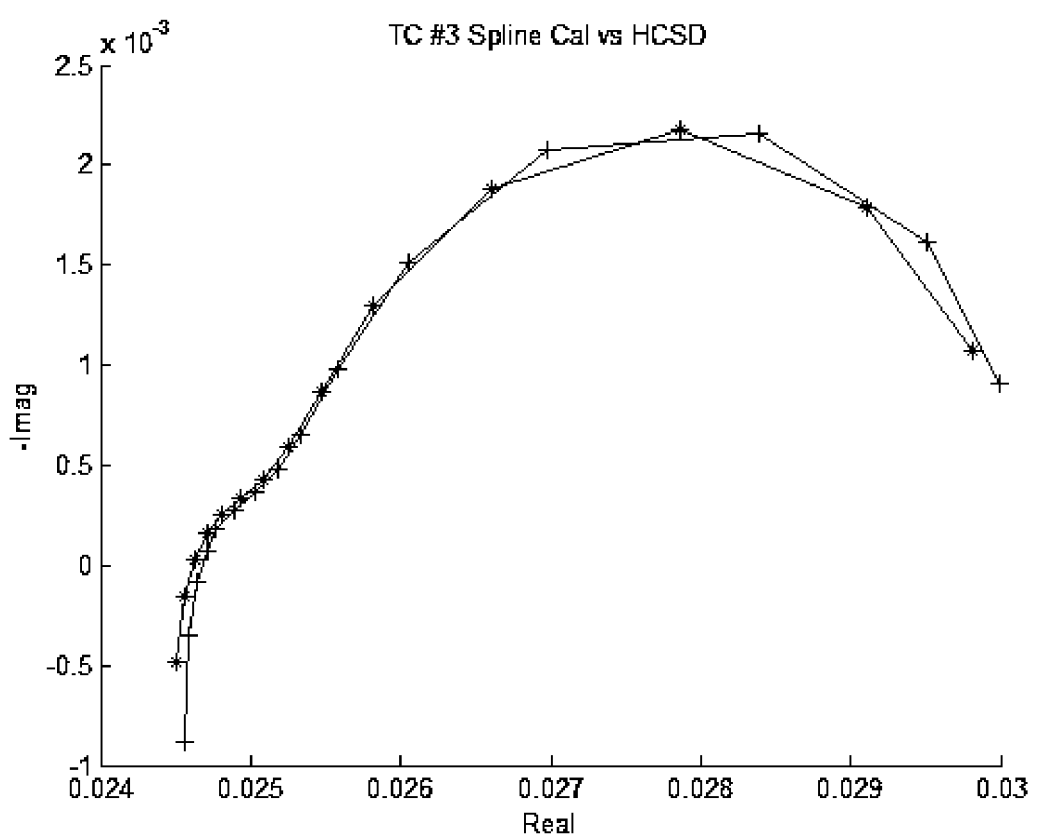
FIG. 10 shows splining the calibration 14 frequencies in octaves downward from 1000 Hz calibrated with 15 frequencies in octaves from 0.1 Hz to 1638.4 Hz.

When a calibration is scaled the objective is to make $V_P$ of a measurement and calibration the same thus the frequency range could be kept standardized as subsets of the calibration frequency range. Never the less, for non-standard subsets, even non-octave harmonic subsets processed via time or frequency CTC (U.S. Pat. No. 8,762,109) the technique of "cubic spline" (U.S. Pat. No. 8,868,363) will select out the calibration constants and they will scale exactly as the above relationship (as shown in FIG. 13, Block B16). FIG. 10 shows splining the calibration of 14 frequencies in octaves downward from 1000 Hz calibrated with 15 frequencies in octaves from 0.1 Hz to 1638.4 Hz (as shown in FIG. 13, Block B17).

Example 4—Application to Saturation Tolerant Time and Frequency CTC

A critical feature of the concept for a High Resolution Impedance Measurement Box (HRIMB) is its ability to digitize signals where the voltage level of the signal is near and occasionally beyond the saturation level of the digitizer within the Data Acquisition system (DAQ). This capability of the HRIMB is realized by replacing the data processing algorithm (HCSD Morrison, W. H., thesis, 2012)) with a variation of time or frequency CTC (U.S. Pat. No. 8,762, 109) (TCTC, FCTC). This feature for these 2 algorithms is achieved by examining the captured voltage time record for saturation points (as shown in FIG. 13, Block B18), noting the exact times of saturation, deleting those points from the voltage time record (as shown in FIG. 13, Block B19), and computing the algorithm correction matrices at only the times for non-saturation. This technique works for both TCTC and FCTC. These algorithms will bring the time domain voltage measurements (with occasional saturation) into the frequency domain but they must be calibrated to become impedance. This is achieved by retrieving an archived time record of a single shunt measurement that has the exact frequencies of the "to be calibrated voltage" measurement, has been normalized to the measurement shunt and its RMS current. That time record is scaled to the RMS current of the "to be calibrated voltage" and the exact points of the saturation in "to be calibrated voltage" time record are deleted from this time record (as shown in FIG. 13, Block B20). It is then processed with the same correction matrices used with the "to be calibrated voltage" time record (as shown in FIG. 13, Block B21). The impedance at each frequency is the ratio of the "to be calibrated voltage" phasor to the calibration phasor. Note that if decimation was used on the time records in the application of TCTC or FCTC the same decimation must be applied to the calibration time record. Decimation is a technique of uniformly discarding data points from time records to speed up data processing for TCTC or FCTC. Depending on the type of battery being tested it should be kept below X16 and should be applied prior to deletion of saturated data points.

Demonstration of saturation tolerance Time CTC algorithm with a 12V lead acid car battery, 500 mA RMS SOS current, 15 frequencies (0.1 Hz to 1638.4 Hz) plotted with the IMB HCSD measurement response is shown in FIG. 11.

Figure 11A:
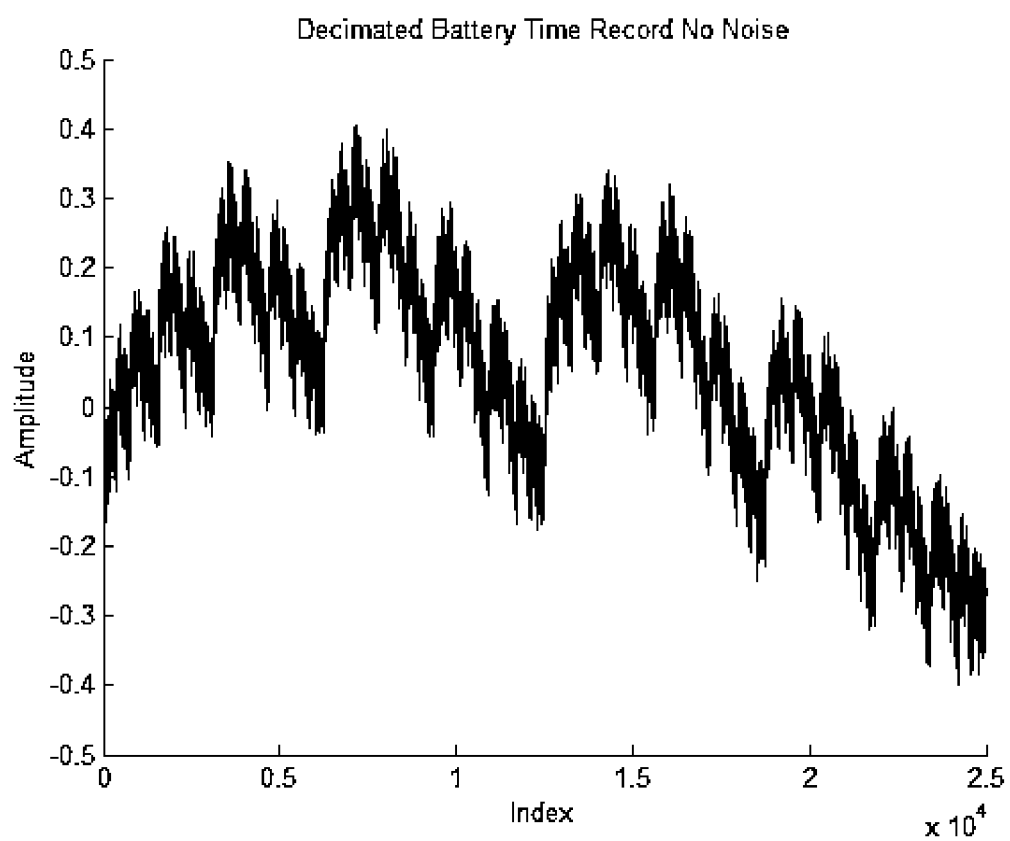
FIG. 11A demonstrates saturation tolerance time CTC algorithm with a 12 V lead acid car battery and shows the unclipped battery time record.
Figure 11B:
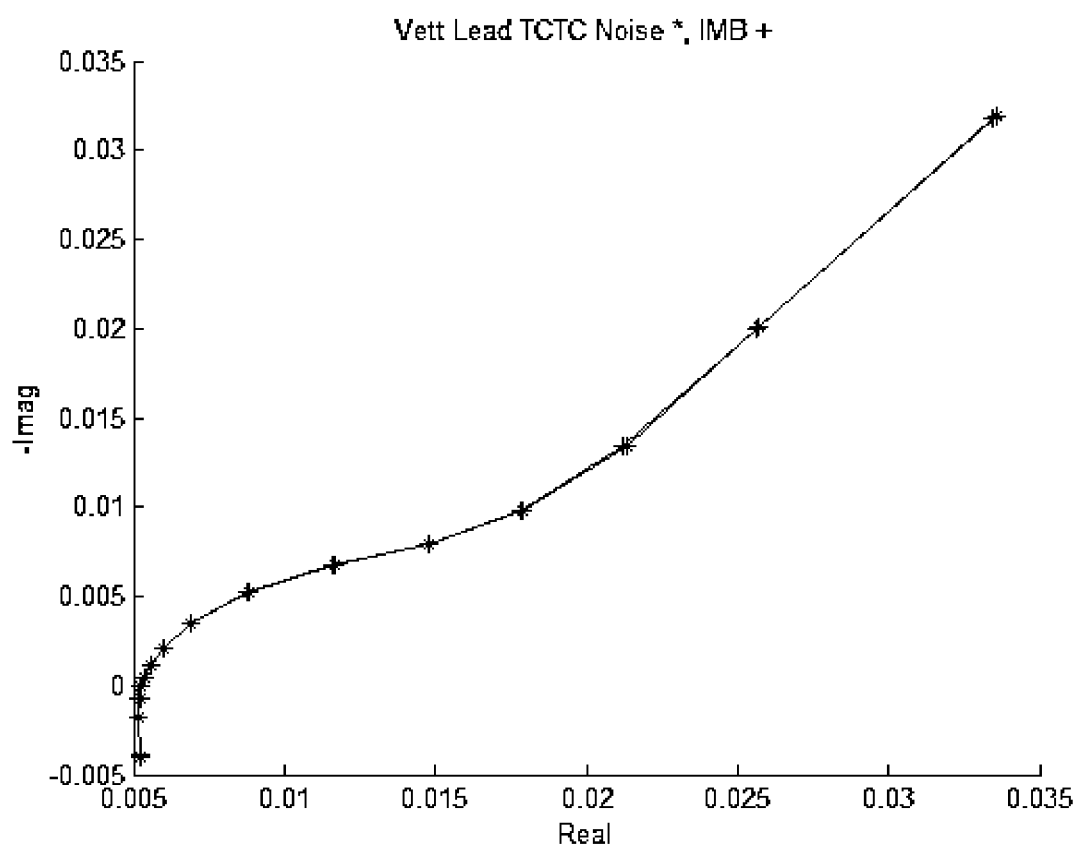
FIG. 11B demonstrates saturation tolerance time CTC algorithm with a 12 V lead acid car battery and shows the unclipped TCTC with baseline HCSD spectrum.
Figure 11C:
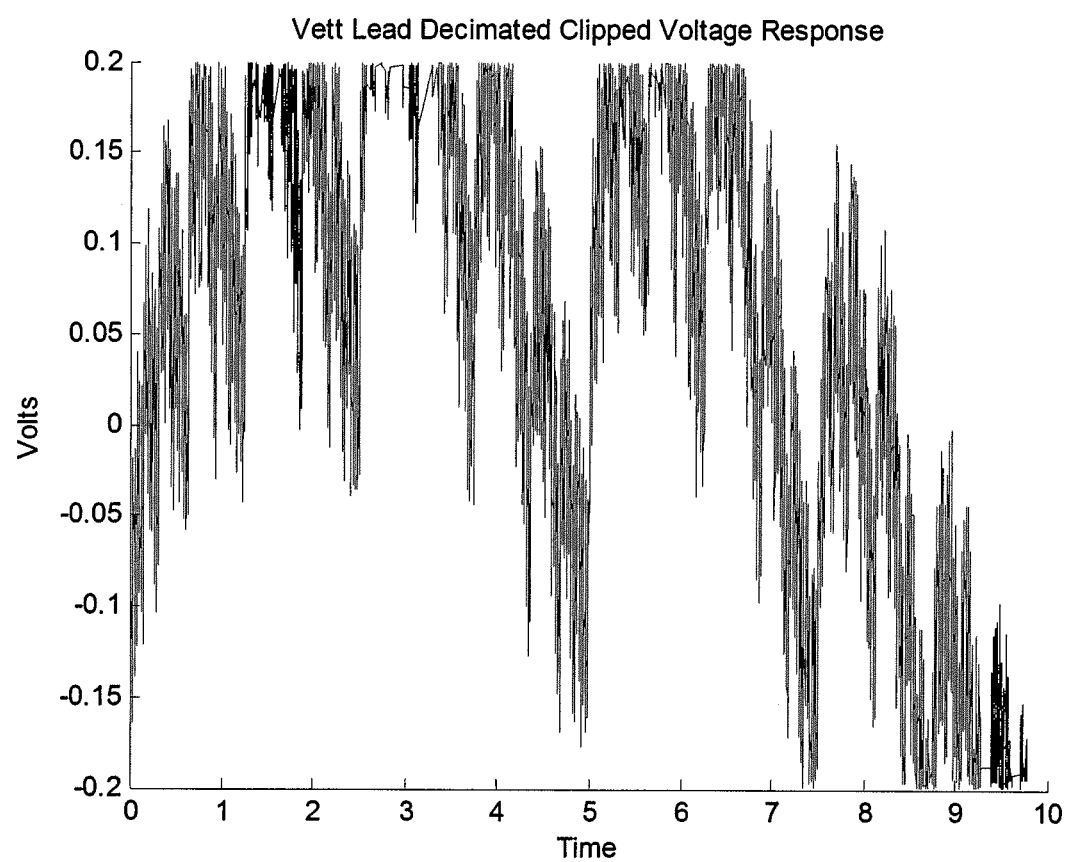
FIG. 11C demonstrates saturation tolerance time CTC algorithm with a 12 V lead acid car battery and shows the clipped battery time record.
Figure 11D:
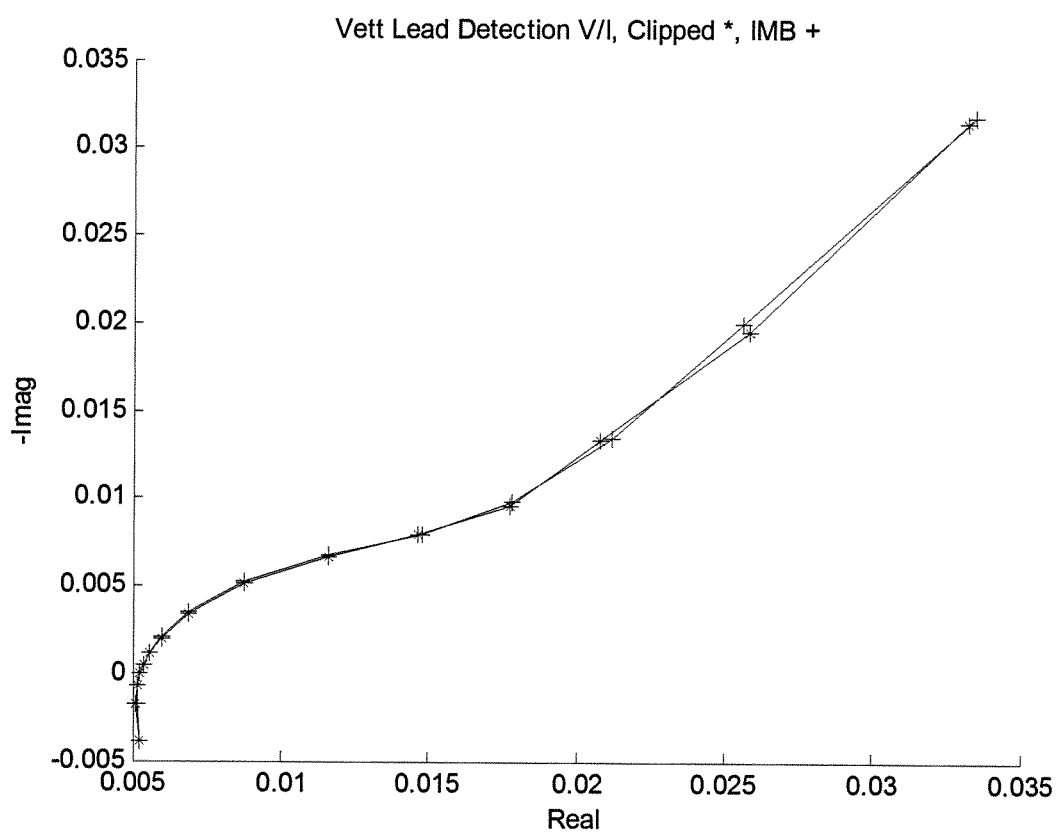
FIG. 11D demonstrates saturation tolerance time CTC algorithm with a 12 V lead acid car battery and shows the clipped spectrum with baseline HCSD spectrum.
Figure 12A:
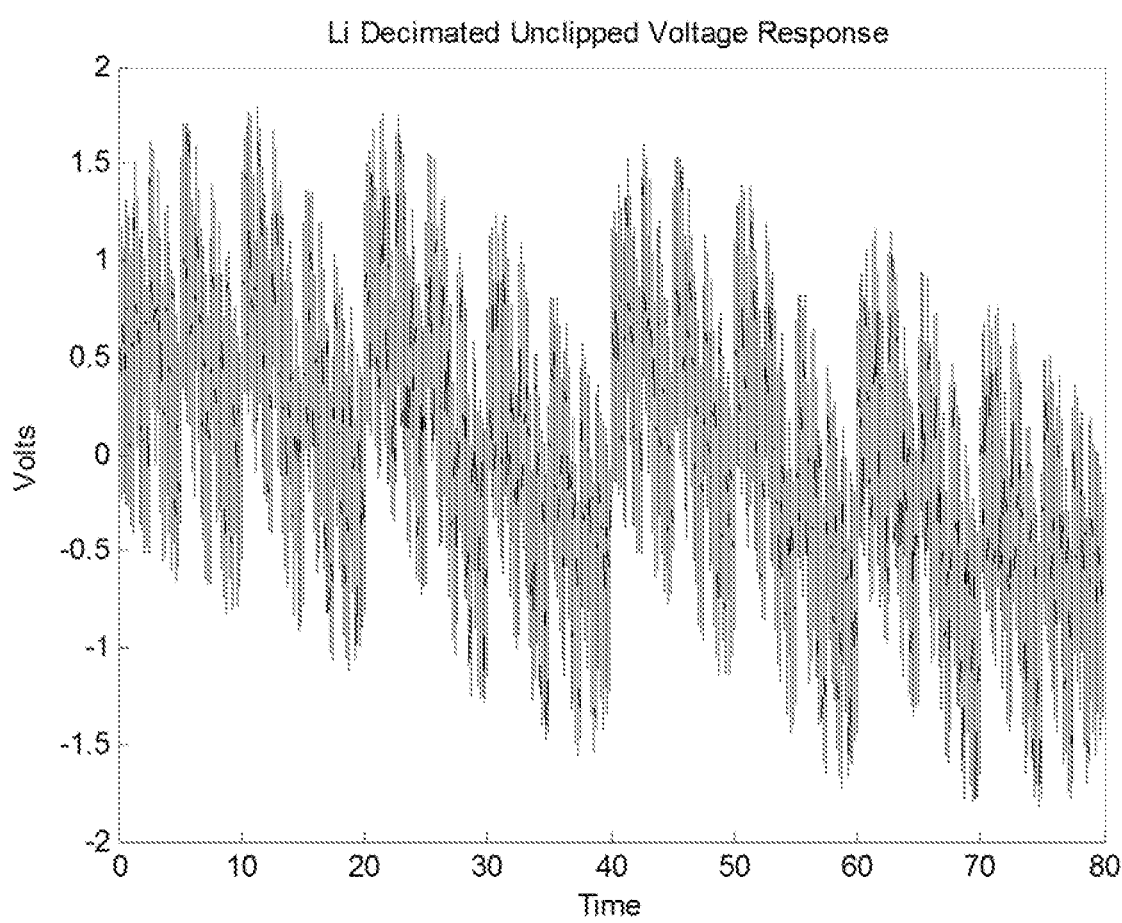
FIG. 12A demonstrates saturation tolerance TCTC algorithm with a Lithium ion battery and shows the unclipped battery time record.
Figure 12B:
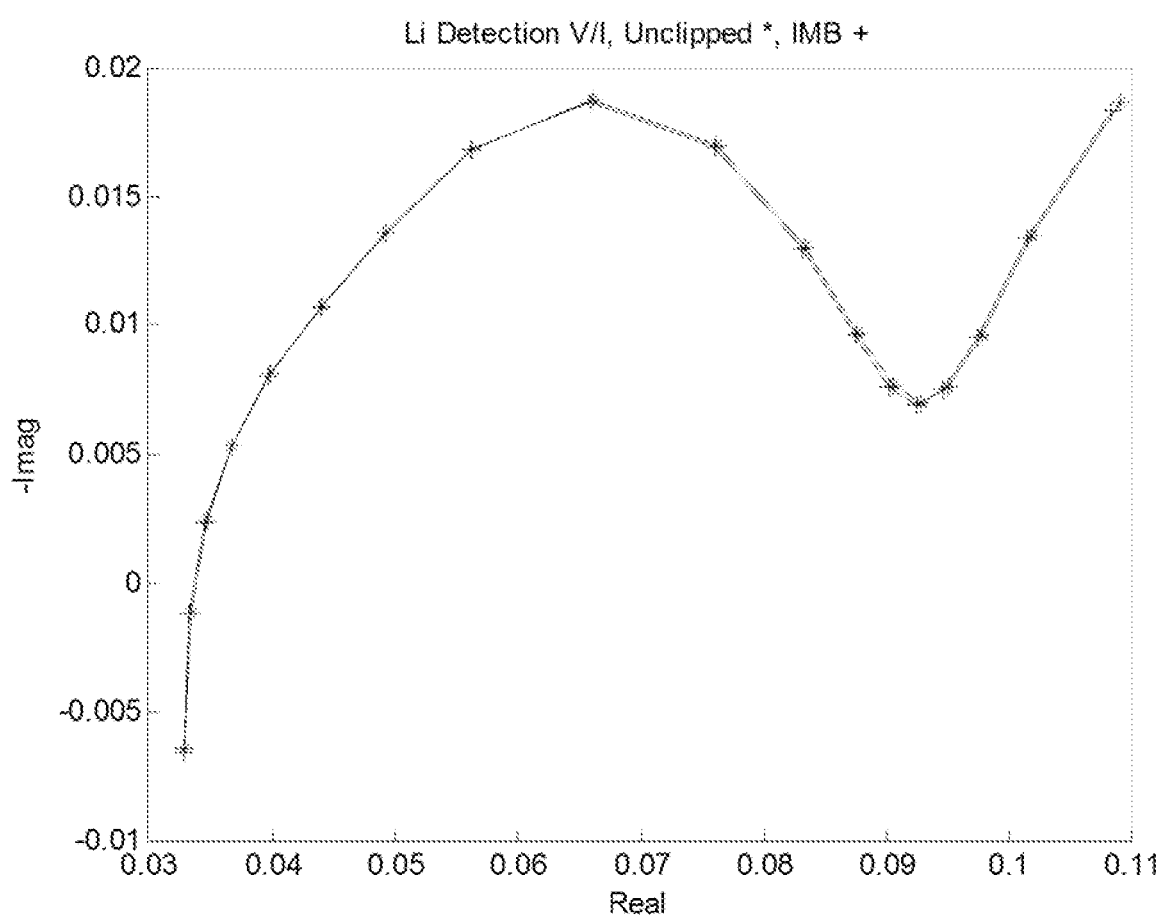
FIG. 12B demonstrates saturation tolerance TCTC algorithm with a Lithium ion battery and shows the unclipped TCTC with baseline HCSD spectrum.
Figure 12C:
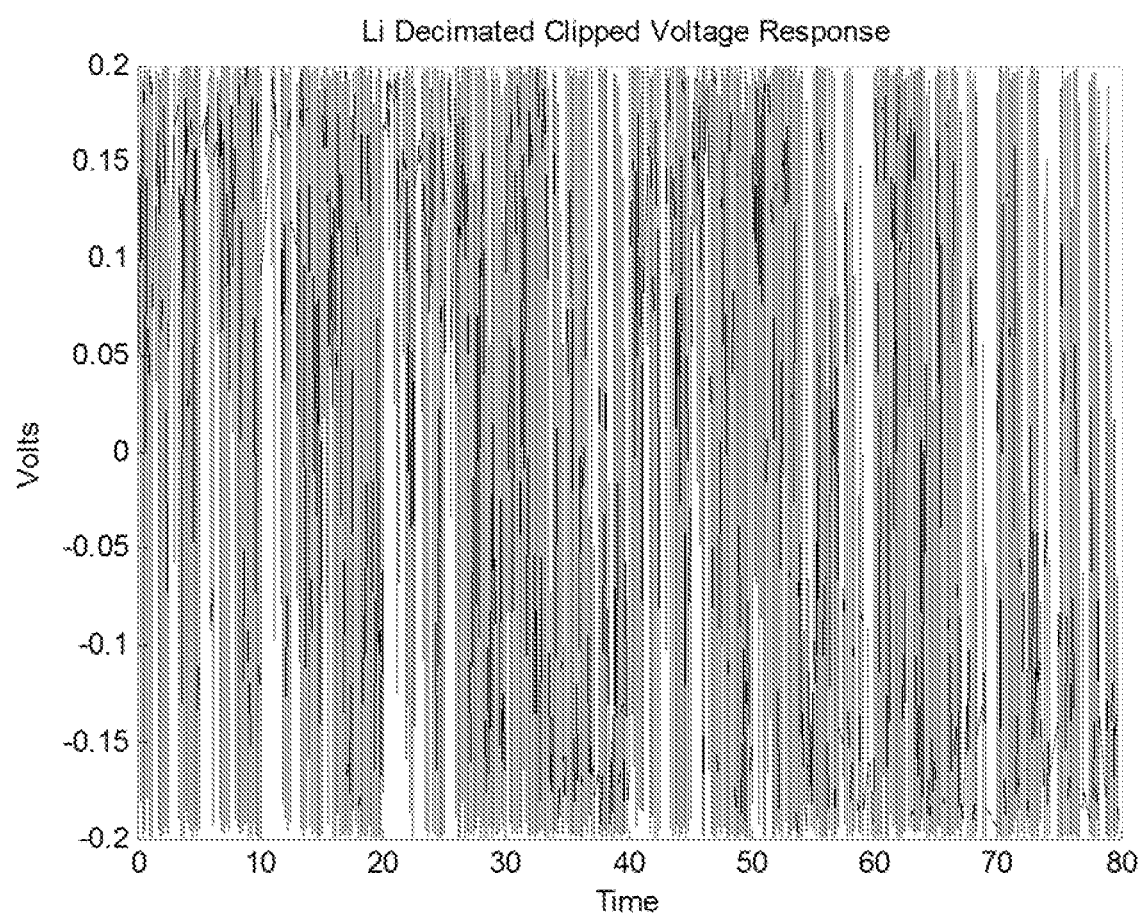
FIG. 12C demonstrates saturation tolerance TCTC algorithm with a Lithium ion battery and shows the clipped battery time record.
Figure 12D:
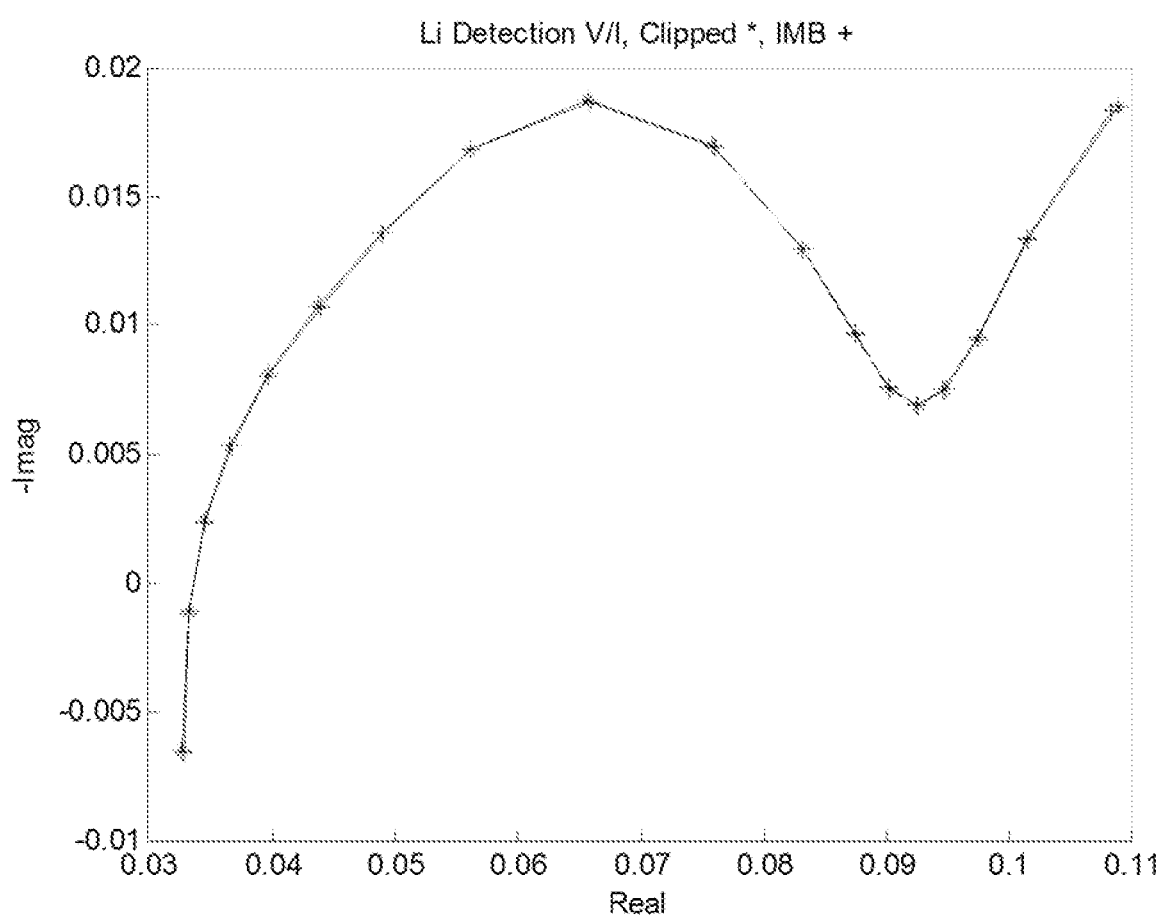
FIG. 12D demonstrates saturation tolerance TCTC algorithm with a Lithium ion battery and shows the clipped spectrum with baseline HCSD spectrum.

Simulated clipping was done by discarding all points in the time record of the response above or below 0.17V. The algorithm was calibrated by a time record of 15 frequencies and 500 mA RMS applied to a shunt. FIG. 11A is the battery voltage time record. FIG. 11B is the spectrum plotted without clipping plotted with the IMB HCSD spectrum. FIG. 11C shows the clipped at +/−0.17V battery voltage time record. FIG. 11D shows the Time CTC clipped spectrum plotted with the baseline HCSD spectrum.

FIG. 12 shows a similar demonstration of time CTC clipping Li Ion battery. An 18 frequency (0.0125 Hz to 1638.4 Hz) 500 mA RMS SOS measurement was made on an Li Ion battery and a 50.27 mOhm shunt. Clipping tolerance was demonstrated by the battery voltage response at +/−0.2V. The Time CTC results are plotted with the baseline HCSD IMB spectrum. FIG. 12A gives the unclipped battery voltage time record. FIG. 12B gives the time CTC processing of FIG. 12A calibrated with the shunt time record plotted with the HCSD baseline spectrum. FIG. 12C gives the +/−0.2V clipped battery voltage time record plotted with the clipping adjusted shunt time record. FIG. 12D gives the time CTC clipped spectrum plotted with the baseline HCSD spectrum. All time CTC processing was done with a X16 decimation.

It is understood that the foregoing examples are merely illustrative of the present invention. Certain modifications of the articles and/or methods may be made and still achieve the objectives of the invention. Such modifications are contemplated as within the scope of the claimed invention.

The invention claimed is:

1. An impedance measurement apparatus, comprising:
   a current driver configured to generate an excitation current signal to be applied to a device;
   a processor communicatively coupled to a non-transitory computer readable media containing a program code, said program code executed under control of said processor to:
   excite said device using said excitation signal including a root mean squared current or a root mean squared voltage having a plurality of frequencies in a frequency range;
   record a response time record of said device excited using said excitation signal;
   discard said response time record of said device corresponding to a fraction of a period of lowest frequency of said plurality of frequencies in said excitation signal;
   apply a calibration record to said response time record of said device; and
   perform a single calculation of impedance of said device based on said calibration record applied to said response time record.

2. The apparatus of claim 1, wherein said computer readable code further executable to:
   transform said response time record of said device to a frequency domain; and
   normalize said response time record of said device transformed to said frequency domain.

3. The apparatus of claim 1, further comprising:
   excite one non-inductive shunt having one non-inductive shunt value using said excitation signal including said root mean squared current or said root mean squared voltage having said plurality of frequencies in said frequency range;
   record a response time record of said one non-inductive shunt; and
   generate said calibration record based on said response time record of said one non-inductive shunt.

4. The apparatus of claim 3, further comprising:
transform each said response time record of said non-inductive shunt to said frequency domain; and
normalize said response time record of said non-inductive shunt transformed to said frequency domain to said non-inductive shunt value.

5. The apparatus of claim 1, wherein said response time record includes a negative time portion corresponding to said fraction of said period of said lowest frequency of said plurality of frequencies in said excitation signal; and wherein discard of said response time record corresponds to said negative time portion of said response time record.

6. The apparatus of claim 1, wherein said computer code further executed to:
determine time periods in said response time record where a voltage level exceeds a saturation level of a digitizer within a data acquisition system;
discard said time periods in said response time record;
discard said time periods in said calibration record;
apply said calibration record having said time periods discarded to said time response record having said time periods discarded; and
calculate impedance of said device.

7. A method of operating an impedance measurement apparatus, comprising:
configuring a current driver to generate an excitation current signal to be applied to a device;
executing a program code contained in a non-transitory computer readable media under control of a processor to actuate said current driver;
exciting said device using said excitation signal including a root mean squared current or a root mean squared voltage having a plurality of frequencies in a frequency range;
recording a response time record of said device excited with said excitation signal;
discarding said response time record of said device corresponding to a fraction of a period of lowest frequency of said plurality of frequencies in said excitation signal;
applying a calibration record to said response time record of said device; and
performing a single calculation of impedance of said device based on said calibration record applied to said response time record.

8. The method of claim 7, further comprising:
exciting one non-inductive shunt having one non-inductive shunt value using an excitation signal including said root mean squared current or root mean squared voltage having said plurality of frequencies in said frequency range;
recording a response time record of said one non-inductive shunt; and
generating said calibration record based on said response time record of said one non-inductive shunt.

9. The method of claim 8, further comprising:
transforming said response time record of said one non-inductive shunt to a frequency domain; and
normalizing said response time record of said one non-inductive shunt to said one non-inductive shunt value and said excitation signal including said root mean square current or said root mean squared voltage having said plurality of frequencies in said frequency range.

10. The method of claim 7, wherein said response time record includes a negative time portion corresponding to said fraction of said period of said lowest frequency of said plurality of frequencies in said excitation signal, wherein discard of said response time record corresponds to said negative time portion of said response time record.

11. The method of claim 7, further comprising:
analyzing said response time record of said device;
determining time periods in said response time record of said device where a voltage level exceeds a saturation level of a digitizer within a data acquisition system;
discarding said time periods in said response time record of said device where said voltage level exceeds said saturation level of said digitizer;
discarding said time periods in said calibration record which correspond to said time periods discarded in said response time record of said device;
applying said calibration record having said time periods discarded to said time response record of said device having said time periods discarded; and
calculating said impedance of said device.

* * * * *